(12) United States Patent
Kuriyama et al.

(10) Patent No.: US 9,761,802 B2
(45) Date of Patent: Sep. 12, 2017

(54) EVAPORATION MASK AND METHOD OF MANUFACTURING DISPLAY UNIT

(71) Applicant: Sony Corporation, Tokyo (JP)

(72) Inventors: Kentaro Kuriyama, Kanagawa (JP); Hiroichi Ishikawa, Tokyo (JP); Tomohiro Kubo, Kanagawa (JP)

(73) Assignee: Sony Corporation, Tokyo (JP)

( * ) Notice: Subject to any disclaimer, the term of this patent is extended or adjusted under 35 U.S.C. 154(b) by 30 days.

(21) Appl. No.: 14/453,681

(22) Filed: Aug. 7, 2014

(65) Prior Publication Data

US 2015/0050767 A1    Feb. 19, 2015

(30) Foreign Application Priority Data

Aug. 14, 2013   (JP) ................................. 2013-168591

(51) Int. Cl.
| | |
|---|---|
| *B05C 21/00* | (2006.01) |
| *C23C 14/04* | (2006.01) |
| *C23C 16/04* | (2006.01) |
| *H01L 51/00* | (2006.01) |
| *H01L 51/56* | (2006.01) |

(52) U.S. Cl.
CPC ........ *H01L 51/0011* (2013.01); *C23C 14/042* (2013.01); *H01L 51/001* (2013.01); *H01L 51/56* (2013.01); *C23C 16/042* (2013.01)

(58) Field of Classification Search
None
See application file for complete search history.

(56) References Cited

U.S. PATENT DOCUMENTS

| | | | | |
|---|---|---|---|---|
| 2004/0020435 A1* | 2/2004 | Tsuchiya | .............. | C23C 14/042 118/723 VE |
| 2004/0163592 A1* | 8/2004 | Abiko | ................... | C23C 14/042 118/715 |
| 2006/0213442 A1* | 9/2006 | Park | ..................... | C23C 14/042 118/720 |
| 2011/0146573 A1* | 6/2011 | Park | ..................... | C23C 14/042 118/712 |
| 2012/0234235 A1* | 9/2012 | Lee | ....................... | C23C 14/042 118/504 |
| 2012/0279445 A1* | 11/2012 | Kim | ..................... | C23C 14/042 118/504 |

(Continued)

FOREIGN PATENT DOCUMENTS

| | | | |
|---|---|---|---|
| JP | H07-038231 | * | 2/1995 |
| JP | 2003039633 A | * | 2/2003 |

(Continued)

*Primary Examiner* — Binu Thomas
(74) *Attorney, Agent, or Firm* — Wolf, Greenfield & Sacks, P.C.

(57) ABSTRACT

An evaporation mask includes: a mask body including a pattern region configured of a plurality of passage holes; and an adjusting frame configured to hold the mask body and having a mechanism capable of adjusting positions of the passage holes on the mask body. The adjusting frame has a frame-like base material, and a movable member that is provided along one or more sides of the base material to be bonded with an outer edge of the mask body, and at least a part of which is deformable on the base material. One or a plurality of slits are provided at a selective region of the movable member.

11 Claims, 41 Drawing Sheets

(56) References Cited

U.S. PATENT DOCUMENTS

2015/0068456 A1* 3/2015 Kuriyama ............. C23C 14/042
 118/505

FOREIGN PATENT DOCUMENTS

| JP | 2004-006257 A | | 1/2004 |
|----|---|---|---|
| JP | 2004247718 A | * | 9/2004 |
| WO | WO 2013/150699 A1 | * | 10/2013 |

* cited by examiner (ONE SCALE=5 μm)

■ : OBSERVED VALUES
◆ : TARGET VALUES (ONE SCALE=5 μm)

■ : OBSERVED VALUES
◆ : TARGET VALUES (ONE SCALE=5 μm)

■ : OBSERVED VALUES
♦ : TARGET VALUES (ONE SCALE=5 μm)

♦ : BEFORE WELDING (REFERENCE)
■ : AFTER WELDING

EVAPORATION MASK AND METHOD OF MANUFACTURING DISPLAY UNIT

CROSS REFERENCE TO RELATED APPLICATIONS

This application claims the benefit of Japanese Priority Patent Application JP 2013-168591 filed on Aug. 14, 2013, the entire contents of which are incorporated herein by reference.

BACKGROUND

The present disclosure relates to an evaporation mask that adjusts a stress to be applied to a mask in use for vapor deposition and the like, and a method of manufacturing a display unit using the evaporation mask.

For example, in a manufacturing process of a display unit using an organic EL (Electroluminescence) device, a pattern of an organic film may be formed on a substrate for each of red (R), green (G), and blue (B) pixels in a vacuum vapor deposition method using an evaporation mask.

As an example, such an evaporation mask may be manufactured as follows. First, a mask body (mask foil) in which many microscopic passage holes (apertures) are patterned is formed using an electro-casting process, a photoetching process, or the like. Thereafter, the mask body is fixed to a frame through welding and the like with tension applied to the mask body.

However, after the mask body is fixed to the frame, it may be difficult to adjust the tension of a mask portion, and to deal with a case where deformation occurs, or any other cases. Further, within a mask surface, variations in stress may arise depending on a formation density of the passage holes, a film thickness distribution, or the like. In addition, because of an individual difference in deformation amount of a frame itself, it may be difficult to predict the deformation amount of the mask preliminarily. Accordingly, a method has been proposed that corrects positions of the passage holes after the mask is fixed to the frame (for example, see Japanese Unexamined Patent Application Publication No. 2004-6257).

In the method described in Japanese Unexamined Patent Application Publication No. 2004-6257 as mentioned above, there are provided a mask body that is held on a frame, a guide member that is bonded with one or more sides of the mask body, and a tension-applying section that applies predetermined tension to the mask body through the guide member. The tension-applying section includes screw holes that are formed on a sidewall of the guide member, and screws that are capable of being inserted into the screw holes and front edges of which abut on a side surface of the frame. An operator tightens or loosens the screws, thereby allowing the tension to be applied to the mask body (for example, see Paragraphs [0031] to [0035] and FIG. 4 in the patent specification of Japanese Unexamined Patent Application Publication No. 2004-6257).

SUMMARY

In such an evaporation mask, in association with higher-volume production, increasing size, and higher-definition images of a display panel, or other factors, it has been desired to improve the positional accuracy of passage holes that are patterned on a mask body (mask patterns).

It is desirable to provide an evaporation mask capable of improving the positional accuracy of mask patterns, and a method of manufacturing a display unit using such an evaporation mask.

According to an embodiment of the present disclosure, there is provided a first evaporation mask including: a mask body including a pattern region configured of a plurality of passage holes; and an adjusting frame configured to hold the mask body and having a mechanism capable of adjusting positions of the passage holes on the mask body, wherein the adjusting frame has a frame-like base material, and a movable member that is provided along one or more sides of the base material to be bonded with an outer edge of the mask body, and at least a part of which is deformable on the base material, and one or a plurality of slits are provided at a selective region of the movable member.

In the first evaporation mask according to the above-described embodiment of the present disclosure, there are provided the mask body including the pattern region configured of the plurality of passage holes, and the adjusting frame that holds the mask body and has the mechanism capable of adjusting positions of the passage holes. In the adjusting frame, the movable member is provided along one or more sides of the base material, and the outer edge of the mask body is bonded with this movable member. One or more slits are provided at a selective region of the movable member, thus allowing the positions of the passage holes on the mask body to be locally adjusted.

According to an embodiment of the present disclosure, there is provided a second evaporation mask including: a mask body including a pattern region configured of a plurality of passage holes; and an adjusting frame configured to hold the mask body and having a mechanism capable of adjusting positions of the passage holes on the mask body, wherein the adjusting frame has a frame-like base material, and a movable member that is provided along one or more sides of the base material to be bonded with an outer edge of the mask body, and at least a part of which is deformable on the base material, and the movable member is provided in proximity to the pattern region.

In the second evaporation mask according to the above-described embodiment of the present disclosure, there are provided the mask body including the pattern region configured of the plurality of passage holes, and the adjusting frame that holds the mask body and has the mechanism capable of adjusting positions of the passage holes. In the adjusting frame, the movable member is provided along one or more sides of the base material, and the outer edge of the mask body is bonded with this movable member. The movable member is provided in proximity to the pattern region, thus allowing the positions of the passage holes on the mask body to be locally adjusted.

According to an embodiment of the present disclosure, there is provided a third evaporation mask including: a mask body including a pattern region configured of a plurality of passage holes; and an adjusting frame configured to hold the mask body and having a mechanism capable of adjusting positions of the passage holes on the mask body, wherein the adjusting frame has a frame-like base material, and a plurality of movable members each provided along each side of the base material to be bonded with an outer edge of the mask body, and at least a part each of which is deformable on the base material, and the plurality of movable members are provided in conjunction with one another.

In the third evaporation mask according to the above-described embodiment of the present disclosure, there are provided the mask body including the pattern region configured of the plurality of passage holes, and the adjusting frame that holds the mask body and has the mechanism capable of adjusting positions of the passage holes. In the adjusting frame, the plurality of movable members are provided along each side of the base material, and the outer edge of the mask body is bonded with each of the movable members. These movable members are provided in conjunction with one another, and thus it is less likely that wrinkling will occur in the mask body due to a relative positional displacement among the movable members during a heating process (vapor deposition and cleaning processes and the like), for example.

According to an embodiment of the present disclosure, there is provided a fourth evaporation mask including: a mask body including a pattern region configured of a plurality of passage holes; and an adjusting frame configured to hold the mask body and having a mechanism capable of adjusting positions of the passage holes on the mask body, wherein the adjusting frame has a frame-like base material, and a movable member that is provided along one or more sides of the base material to be bonded with an outer edge of the mask body, and at least a part of which is deformable on the base material, and the movable member has a recessed portion on a surface in opposition to the mask body.

In the fourth evaporation mask according to the above-described embodiment of the present disclosure, there are provided the mask body including the pattern region configured of the plurality of passage holes, and the adjusting frame that holds the mask body and has the mechanism capable of adjusting positions of the passage holes. In the adjusting frame, the movable member is provided along one or more sides of the base material, and the outer edge of the mask body is bonded with this movable member. The movable member has the recessed portion on a surface in opposition to the mask body, thus suppressing displacement of the passage holes that may be caused in bonding the mask body with the adjusting frame, for example.

According to an embodiment of the present disclosure, there is provided a first method of manufacturing a display unit, the method including: forming a first electrode; forming an organic layer including a light-emitting layer on the first electrode with use of an evaporation mask; and forming a second electrode on the organic layer, wherein the evaporation mask includes a mask body including a pattern region configured of a plurality of passage holes, and an adjusting frame configured to hold the mask body and having a mechanism capable of adjusting positions of the passage holes on the mask body, the adjusting frame has a frame-like base material, and a movable member that is provided along one or more sides of the base material to be bonded with an outer edge of the mask body, and at least a part of which is deformable on the base material, and one or a plurality of slits are provided at a selective region of the movable member.

According to an embodiment of the present disclosure, there is provided a second method of manufacturing a display unit, the method including: forming a first electrode; forming an organic layer including a light-emitting layer on the first electrode with use of an evaporation mask; and forming a second electrode on the organic layer, wherein the evaporation mask includes a mask body including a pattern region configured of a plurality of passage holes, and an adjusting frame configured to hold the mask body and having a mechanism capable of adjusting positions of the passage holes on the mask body, the adjusting frame has a frame-like base material, and a movable member that is provided along one or more sides of the base material to be bonded with an outer edge of the mask body, and at least a part of which is deformable on the base material, and the movable member is provided in proximity to the pattern region.

According to an embodiment of the present disclosure, there is provided a third method of manufacturing a display unit, the method including: forming a first electrode; forming an organic layer including a light-emitting layer on the first electrode with use of an evaporation mask; and forming a second electrode on the organic layer, wherein the evaporation mask includes a mask body including a pattern region configured of a plurality of passage holes, and an adjusting frame configured to hold the mask body and having a mechanism capable of adjusting positions of the passage holes on the mask body, the adjusting frame has a frame-like base material, and a plurality of movable members each provided along each side of the base material to be bonded with an outer edge of the mask body, and at least a part each of which is deformable on the base material, and the plurality of movable members are provided in conjunction with one another.

According to an embodiment of the present disclosure, there is provided a fourth method of manufacturing a display unit, the method including: forming a first electrode; forming an organic layer including a light-emitting layer on the first electrode with use of an evaporation mask; and forming a second electrode on the organic layer, wherein the evaporation mask includes a mask body including a pattern region configured of a plurality of passage holes, and an adjusting frame configured to hold the mask body and having a mechanism capable of adjusting positions of the passage holes on the mask body, the adjusting frame has a frame-like base material, and a movable member that is provided along one or more sides of the base material to be bonded with an outer edge of the mask body, and at least a part of which is deformable on the base material, and the movable member has a recessed portion on a surface in opposition to the mask body.

In the first evaporation mask according to the above-described embodiment of the present disclosure, there are provided the mask body including the pattern region configured of the plurality of passage holes, and the adjusting frame that holds the mask body and has the mechanism capable of adjusting positions of the passage holes. In the adjusting frame, the outer edge of the mask body is bonded with the movable member that is provided along one or more sides of the base material. One or more slits are provided at a selective region of the movable member, which enables the positions of the passage holes on the mask body to be locally adjusted, resulting in the positions of the passage holes being allowed to be adjusted quite finely. This makes it possible to improve the positional accuracy of the mask patterns.

In the second evaporation mask according to the above-described embodiment of the present disclosure, there are provided the mask body including the pattern region configured of the plurality of passage holes, and the adjusting frame that holds the mask body and has the mechanism capable of adjusting positions of the passage holes. In the adjusting frame, the outer edge of the mask body is bonded with the movable member that is provided along one or more sides of the base material. This movable member is provided in proximity to the pattern region, which enables the positions of the passage holes on the mask body to be locally adjusted, resulting in the positions of the passage holes being allowed to be adjusted quite finely. This makes it possible to improve the positional accuracy of the mask patterns.

In the third evaporation mask according to the above-described embodiment of the present disclosure, there are provided the mask body including the pattern region configured of the plurality of passage holes, and the adjusting frame that holds the mask body and has the mechanism capable of adjusting positions of the passage holes. In the adjusting frame, the outer edge of the mask body is bonded with the plurality of movable members that are provided along each side of the base material. These movable members are provided in conjunction with one another, and thus it is less likely that wrinkling will occur in the mask body during a heating process (vapor deposition, cleaning processes, and the like), for example. This makes it possible to improve the positional accuracy of the mask patterns.

In the fourth evaporation mask according to the above-described embodiment of the present disclosure, there are provided the mask body including the pattern region configured of the plurality of passage holes, and the adjusting frame that holds the mask body and has the mechanism capable of adjusting positions of the passage holes. In the adjusting frame, the movable member is provided along one or more sides of the base material, and the outer edge of the mask body is bonded with this movable member. The movable member has the recessed portion on a surface in opposition to the mask body, which makes it possible to suppress displacement of the passage holes that may be caused in bonding the mask body with the adjusting frame, for example. This allows the positional accuracy of the mask patterns to be improved.

In the first method of manufacturing a display unit according to the above-described embodiment of the present disclosure, the organic layer is formed using the first evaporation mask according to the above-described embodiment of the present disclosure, thus enabling a pattern of the organic layer to be formed accurately, leading to higher-definition images of a panel.

In the second method of manufacturing a display unit according to the above-described embodiment of the present disclosure, the organic layer is formed using the second evaporation mask according to the above-described embodiment of the present disclosure, thus enabling a pattern of the organic layer to be formed accurately, leading to higher-definition images of a panel.

In the third method of manufacturing a display unit according to the above-described embodiment of the present disclosure, the organic layer is formed using the third evaporation mask according to the above-described embodiment of the present disclosure, thus enabling a pattern of the organic layer to be formed accurately, leading to higher-definition images of a panel.

In the fourth method of manufacturing a display unit according to the above-described embodiment of the present disclosure, the organic layer is formed using the fourth evaporation mask according to the above-described embodiment of the present disclosure, thus enabling a pattern of the organic layer to be formed accurately, leading to higher-definition images of a panel.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the present technology.

DETAILED DESCRIPTION

Hereinafter, some embodiments of the present disclosure are described in details with reference to the drawings. It is to be noted that the descriptions are provided in the order given below.
1. First Embodiment (an example of an evaporation mask using movable members each having slits)
2. Second Embodiment (an example of an evaporation mask that is provided with movable members in proximity to a pattern region of passage holes)
3. Third Embodiment (an example of an evaporation mask using movable members that are joined with one another)
4. Fourth Embodiment (an example of an evaporation mask using movable members each having a recessed portion on a surface in opposition to a mask body)
5. Application Example 1 (an example of an organic EL display unit)
6. Application Example 2 (examples of electronic apparatuses)

First Embodiment

Configuration

Figure 1:
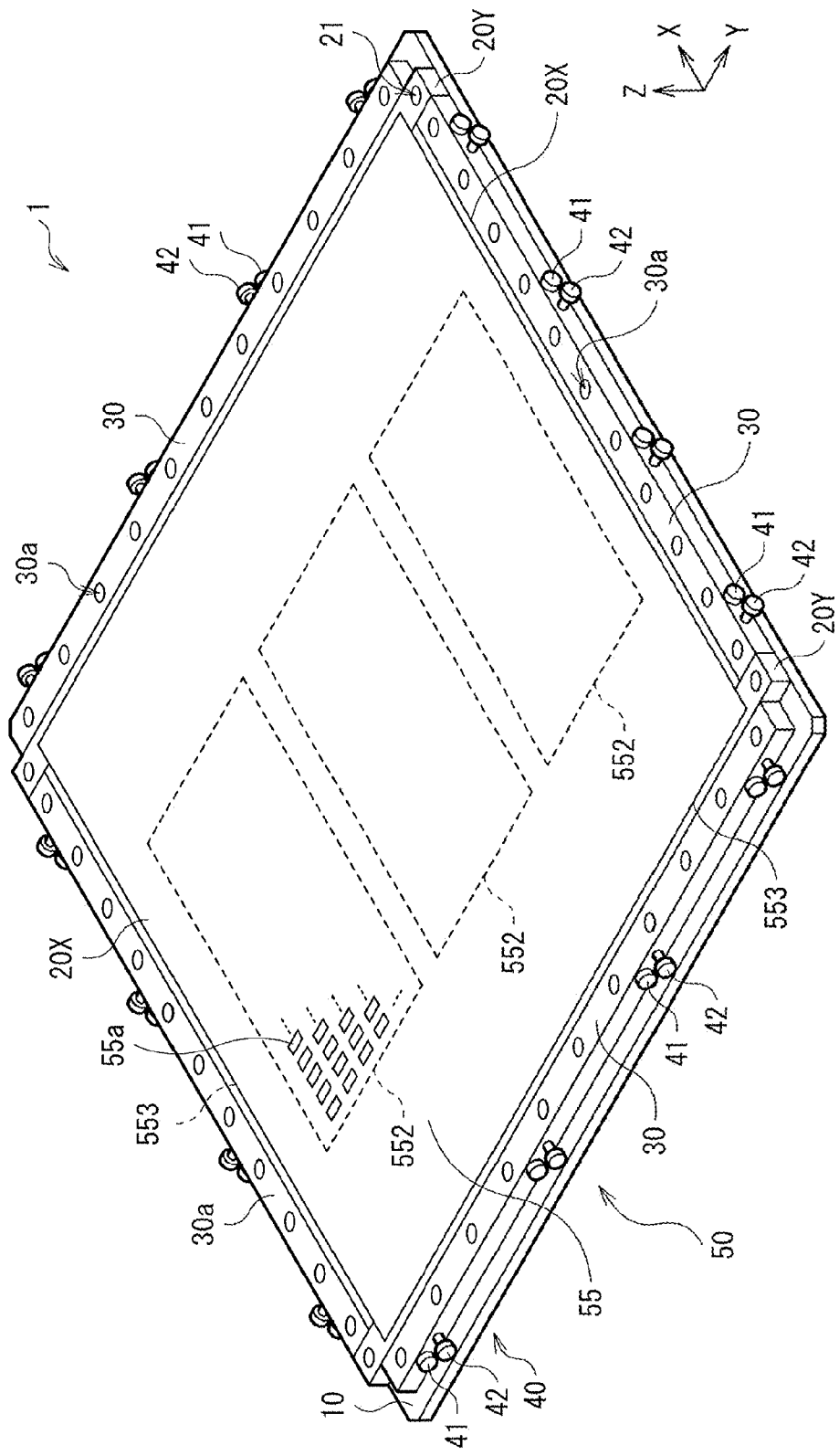
FIG. 1 is a perspective view of an evaporation mask according to a first embodiment of the present disclosure.

FIG. 1 is a perspective view of an evaporation mask (evaporation mask 1) according to a first embodiment of the present disclosure. The evaporation mask 1 may be used in forming an organic layer with use of a vapor deposition technique in a manufacturing process of a display unit using organic EL devices (an organic EL display unit to be hereinafter described), for example. This evaporation mask 1 may include, for example, a mask body 55, and an adjusting frame 50 that holds this mask body 55 and has a predetermined positional adjustment function.

The mask body 55 is a metallic foil that may be made of a material containing one or more kinds of metals such as nickel (Ni), inver (Fe/Ni alloy), and copper (Cu), and may have a thickness within a range of about 10 to 50 μm, for example. On this mask body 55, a pattern region 552 that is configured of a plurality of passage holes 55a to allow vapor deposition materials to pass therethrough is formed.

Figure 2:
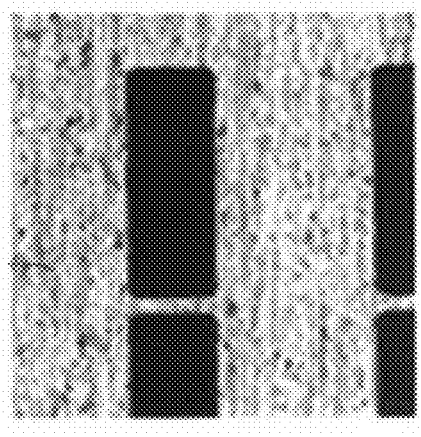
FIG. 2 is an enlarged view showing an example of a passage hole pattern that is formed on a mask body.

The pattern region 552 is configured of the plurality of passage holes 55a that may be two-dimensionally arranged, for example, in a matrix or staggered pattern, and a single passage hole 55a corresponds to an element region to form a single pixel region of a display device. A shape (planar shape) of the passage hole 55a may be, for example, a rectangular form, a square form, a circular form, and the like. As an example of the passage hole 55a, FIG. 2 shows rectangular passage holes 55a (black portions). Via these passage holes 55a, vapor deposition of material such as a low-molecular organic material is carried out. For example, when three-color pixels of R, G, and B are formed in a display device, mask patterns in the number (three) corresponding to the number of the pixel colors are to be used. In an example illustrated in FIG. 1, three pattern regions 552 are formed to be arranged, for example, along a Y-axis direction (two-dimensional arrangement of 1×3). These three pattern regions 552 may correspond to a pattern of any one of R, G, and B colors, for example. With such a configuration, for example, for three display panels, it is possible to carry out the vapor deposition of organic layers at a time.

However, the number of the pattern regions 552 is not limited to three, and may be one, two, or four or more. Further, FIG. 1 exemplifies a configuration in which the pattern regions 552 are arrayed only along a uniaxial direction (Y-axis direction), but a configuration of a two-dimensional arrangement along two-axis directions (X-axis and Y-axis directions) may be acceptable as well. As will hereinafter be described in detail, in the first embodiment, it is possible to adjust positional displacement of the mask pattern that may be caused by a stress arising locally in the proximity of a clearance between the pattern regions 552 (a portion corresponding to corners of the pattern region 552) or at any other location. Therefore, a configuration specific to the first embodiment to be hereinafter described is useful especially when two or more pattern regions 552 are formed on the mask body 55.

The mask body 55 having such pattern regions 552 is fixed to and held by the adjusting frame 50 with predetermined tension applied thereto, for example. In concrete terms, an outer edge 553 of the mask body 55 is bonded with the adjusting frame 50 (more specifically, movable members 20X and 20Y to be hereinafter described) through, for example, spot welding (for example, electrical resistance welding or laser welding). Hereinafter, the description is provided on a specific configuration of the adjusting frame 50.

(Adjusting Frame 50)

Figure 3A:
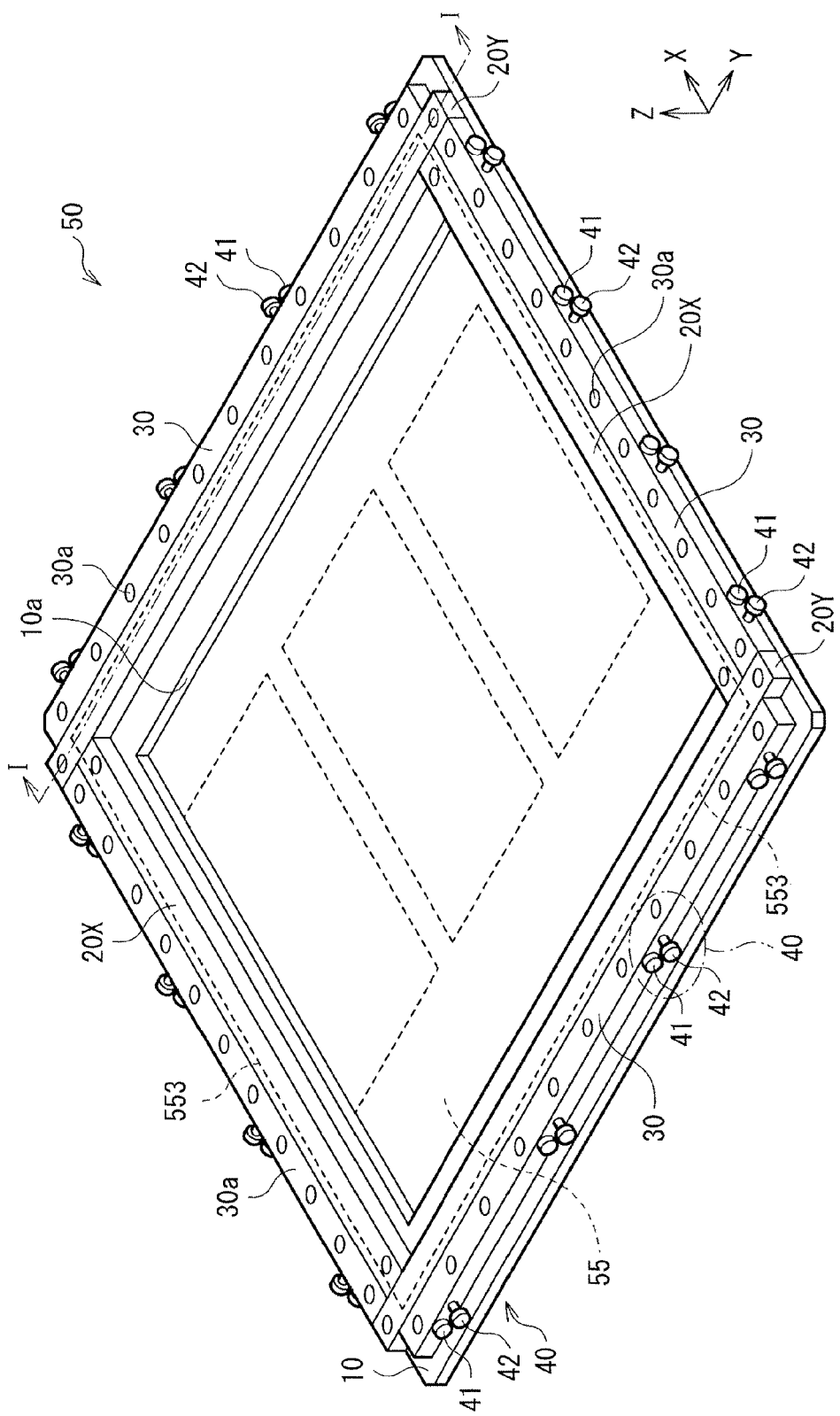
FIG. 3A is a perspective view of an adjusting frame illustrated in FIG. 1.
Figure 3B:
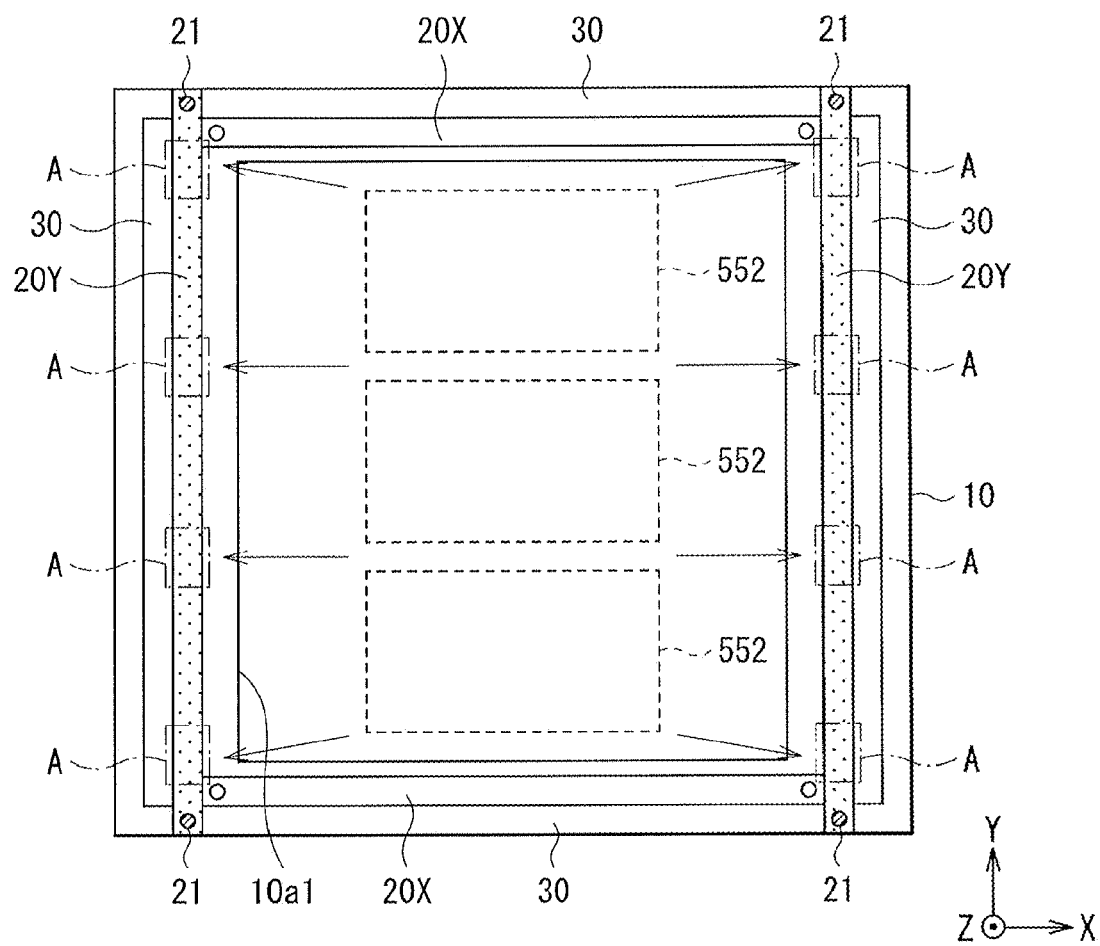
FIG. 3B is an X-Y plan view of the adjusting frame illustrated in FIG. 1.

Each of FIGS. 3A and 3B shows a configuration of the adjusting frame 50. It is to be noted that portions corresponding to the mask body 55 and the pattern regions 552 are denoted with dashed lines. The adjusting frame 50 has a mechanism capable of adjusting positions of the passage holes 55a on the mask body 55. The adjusting frame 50 has a frame-like base frame 10 (base material) having, for example, an aperture 10a. On this base frame 10, there is provided a movable member along one or more sides of the base frame 10. Here, an outline of the base frame 10 may be, for example, a rectangular or square shape, and movable members 20X and 20Y are provided along each of four sides thereof.

Figure 4:
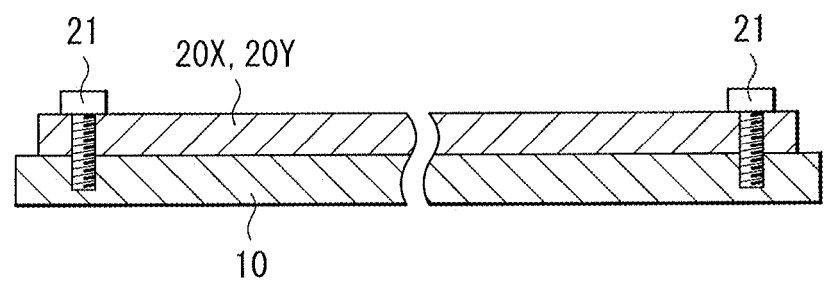
FIG. 4 is a cross-sectional view in a I-I line illustrated in FIG. 3A.

Each of the movable members 20X and 20Y has almost the same structure. The movable member 20X has an elongated shape extending along the X-axis direction, and the movable member 20Y has an elongated shape extending along the Y-axis direction. Both of the movable members 20X and 20Y have screw holes running through along the Z-axis direction on both ends thereof. The movable members 20X and 20Y are fixed to the base frame 10 on both ends thereof in such a manner that fixing bolts 21 are inserted into these screw holes (FIG. 4).

The movable members 20X and 20Y are capable of being at least partly deformed (curved) on the base frame 10. In other words, for example, with both ends each of the movable members 20X and 20Y placed in a fixed state, a region other than both ends is movable along the X-axis direction (or Y-axis direction). Tensile force or pressing force is to be applied to the movable members 20X and 20Y using supporting members 30 and adjusting mechanisms 40 to be hereinafter described, thereby producing the above-described deformation (or movement or shifting).

A frame that is configured of these movable members 20X and 20Y is formed to be almost the same as or slightly larger than the mask body 55 in outline size, and one side each in the X-axis direction and the Y-axis direction may be, for example, about 400 mm in size. The outer edge 553 of the mask body 55 is attached to the top surface each of these movable members 20X and 20Y. The mask body 55 is fixed to the movable members 20 in such a manner that three pattern regions 552 of the mask body 55 are accommodated within the aperture 10a of the base frame 10 in the Z-axis direction.

On the base frame 10, the supporting members 30 are provided along sidewalls (outer wall surfaces) of the movable members 20X and 20Y, and adjusting mechanisms 40 are provided at selective regions each of the supporting members 30. Here, four supporting members 30 are provided along each side of the base frame 10, and each of the supporting members 30 has an elongated shape. Each of the supporting members 30 is provided with many screw holes running through along the Z-axis direction at predetermined spacing intervals. Fixing bolts 30a are inserted into these screw holes to fix each of the supporting members 30 to the base frame 10. In such a manner, the supporting members 30 are formed using a member separately from the base frame 10. However, as an alternative, the supporting members 30 may be formed together with the base frame 10 in an integral molding manner.

Constituent materials for the base frame 10, the supporting member 30, the movable members 20X and 20Y, and the like may preferably include materials having the thermal expansion coefficient equivalent to that of materials for a device substrate to be processed (substrate on which an organic material is evaporated). Examples of such materials may include a stainless steel (SUS) material, an inver material, and the like. This is because such materials ensure that the evaporation mask 1 and the device substrate expand and contract in synchronization with each other with a change in temperature at the time of evaporation, and that the amount of variation in size due to expansion and contraction is made equal. Further, it is possible to minimize the deformation amount of the base frame 10 by forming the base frame 10 having sufficient thickness and high rigidity. Alternatively, a weight may be set up in consideration of transportation or handling performance. In addition, as constituent materials for the movable members 20X and 20Y, the use of relatively soft materials, that is, materials with low Young's modulus may be preferable. This is because such materials ensure the high-precision fine adjustment.

Figure 5:
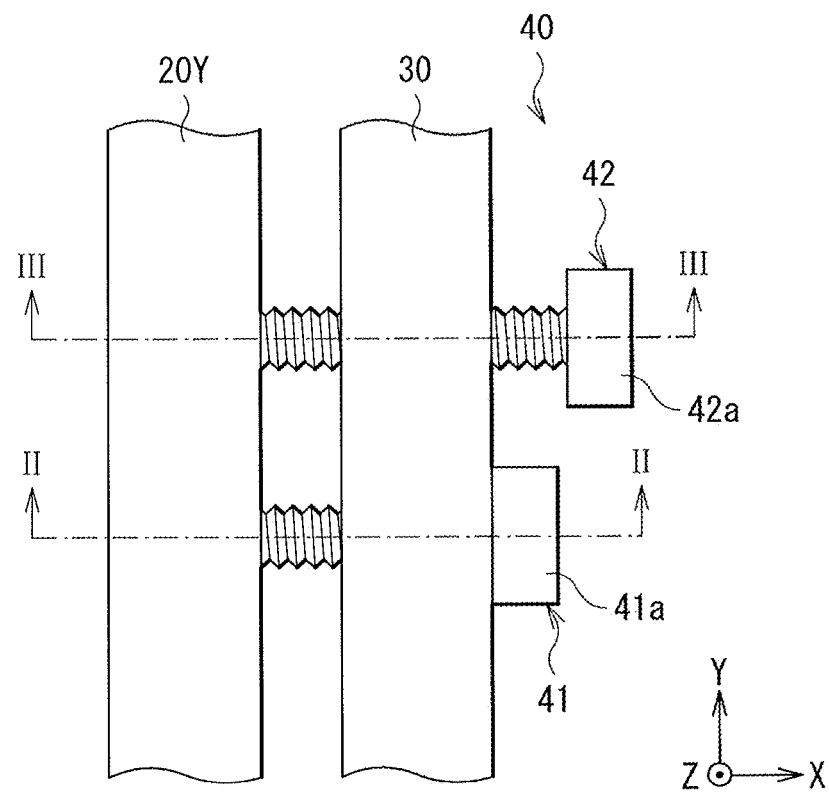
FIG. 5 is an X-Y plan view showing a configuration in the proximity of an adjusting mechanism illustrated in FIG. 1.
Figure 6A:
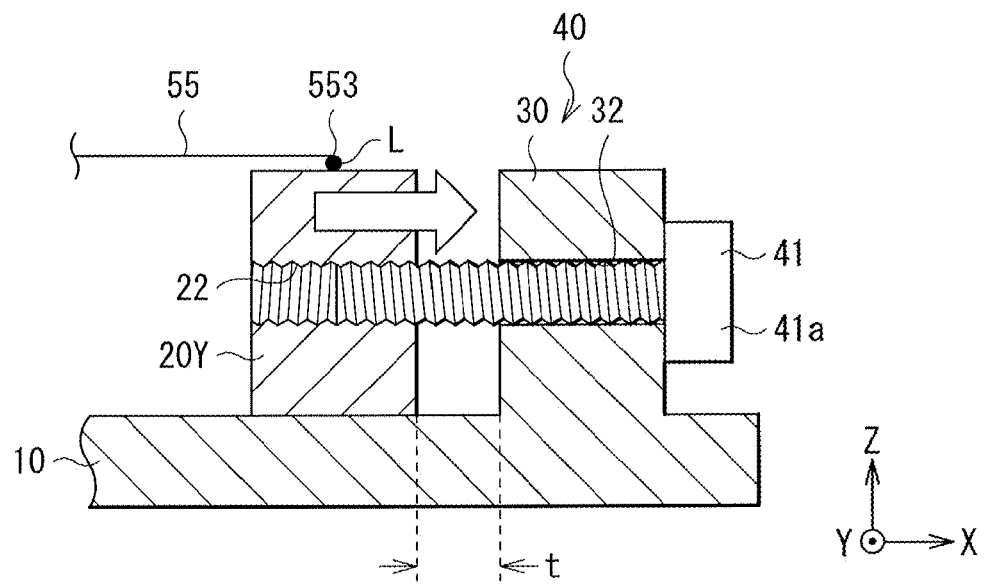
FIG. 6A is a cross-sectional view in a II-II line illustrated in FIG. 5.
Figure 6B:
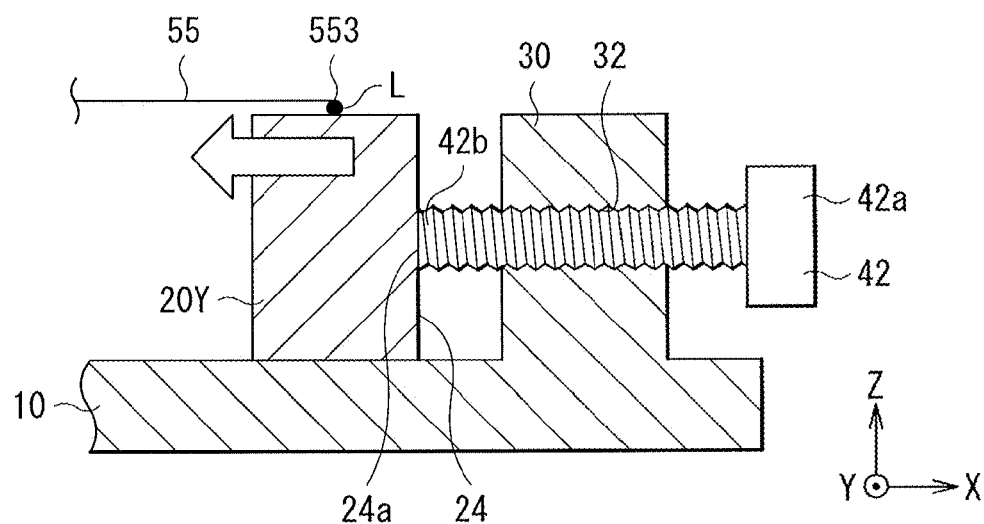
FIG. 6B is a cross-sectional view in a III-III line illustrated in FIG. 5.

The adjusting mechanism 40 includes a pull bolt 41 to apply tension (tensile force) to the movable members 20X and 20Y (that is, the mask body 55) via the supporting members 30, and a push bolt 42 to apply pushing force. FIG. 5 shows an X-Y planar configuration in the proximity of this adjusting mechanism 40. FIG. 6A is a cross-sectional view in a II-II line illustrated in FIG. 5, and FIG. 6B is a cross-sectional view in a III-III line illustrated in FIG. 5. It is to be noted that the description is here provided by citing an example of the adjusting mechanism 40 that is provided on the movable member 20Y among the movable members 20X and 20Y. Further, in each of FIG. 6A and FIG. 6B, a welding point between the mask body 55 and the movable member 20Y is denoted as "L".

The pull bolt 41 and the push bolt 42 are located adjacently in pairs, and the plurality of pairs of pull bolts 41 and push bolts 42 are arrayed at predetermined pitches along the X-axis direction and the Y-axis direction (Y-axis direction in this case). As the pull bolt 41 and the push bolt 42, for example, bolts of M2 (2 mm diameter) to M5 (5 mm diameter) may be used, but usable bolts are not limited to those bolts. It is possible to set up a distance between the pull bolt 41 and the push bolt 42, and a pitch between each of a pair of the bolts (41 and 42) as appropriate.

The supporting member 30 and the movable member 20Y are disposed with a predetermined distance (clearance) "t" in between. It is possible to set up the distance "t" as appropriate considering the deformation amount (shift amount along the Y-axis direction) of the movable member 20Y, as well as dimensions of the pull bolt 41 and the push bolt 42, and the like.

As shown in FIG. 6A, the pull bolt 41 has a head 41a. The movable member 20Y is provided with a screw hole 22 along the X-axis direction, and the supporting member 30 is provided with a through-hole 32 along the coaxial direction of the screw hole 22. The through-hole 32 is not provided with a screw thread. The pull bolt 41 is supported by the through-hole 32, and is inserted into the screw hole 22 of the movable member 20Y. In such a manner that the pull bolt 41 is tightened with the head 41a abutting on the supporting member 30, driving force of the pull bolt 41 acts on the movable member 20Y, thereby shifting the movable member 20Y toward a direction (outer side) approaching the supporting member 30.

In adjusting positions of the passage holes 55a, by using this pull bolt 41, it is possible to apply tensile force (tension) to the mask body 55 (movable member 20Y) from the outer edge 553 toward the outer side of the mask body 55. As a result, the positions of the passage holes 55a are adjusted to be shifted toward the outer side of the mask body 55.

As shown in FIG. 6B, the push bolt 42 has a head 42a. The supporting member 30 is provided with a screw hole 33 along the X-axis direction, and the push bolt 42 is supported by the supporting member 30 by being inserted into the screw hole 33. A front edge (end) 42b of the push bolt 42 abuts on a side surface 24 of the movable member 20Y (the movable member 20Y has a region 24a abutting on the front edge 42b of the push bolt 42). In such a manner that the push bolt 42 is tightened with the front edge 42b of the push bolt 42 abutting on the side surface 24 of the movable member 20Y, driving force of the push bolt 42 acts on the movable member 20Y, thereby shifting the movable member 20Y toward a direction (inner side) getting away from the supporting member 30.

In adjusting positions of the passage holes 55a, by using the push bolt 42, it is possible to apply pressing force to the mask body 55 (movable member 20Y) from the outer edge 553 toward the inner side (center side) of the mask body 55. As a result, the positions of the passage holes 55a are adjusted to be shifted toward the inner side of the mask body 55.

As an alternative, a nut may be attached by screwing on a screw portion each of these pull bolt 41 and push bolt 42. In this case, rotation driving force of the nut is transmitted to the movable member 20Y via the nut.

As described above, the use of the adjusting mechanism 40 including the pull bolt 41 and push bolt 42 makes it possible to apply both of tensile force and pressing force to the mask body 55. The provision of such adjusting mechanisms 40 on both of the movable members 20X and 20Y allows the positions of the passage holes 55a of the mask body 55 to be adjusted along biaxial directions (X-axis direction and Y-axis direction).

The evaporation mask 1 may be provided with a holding mechanism (fixing mechanism for the movable members 20X and 20Y) that holds the positions of the passage holes 55a after the positional adjustment of the mask patterns. Each of FIG. 7A to FIG. 7C is a cross-sectional view showing an example of such a fixing mechanism.

Figure 7A:
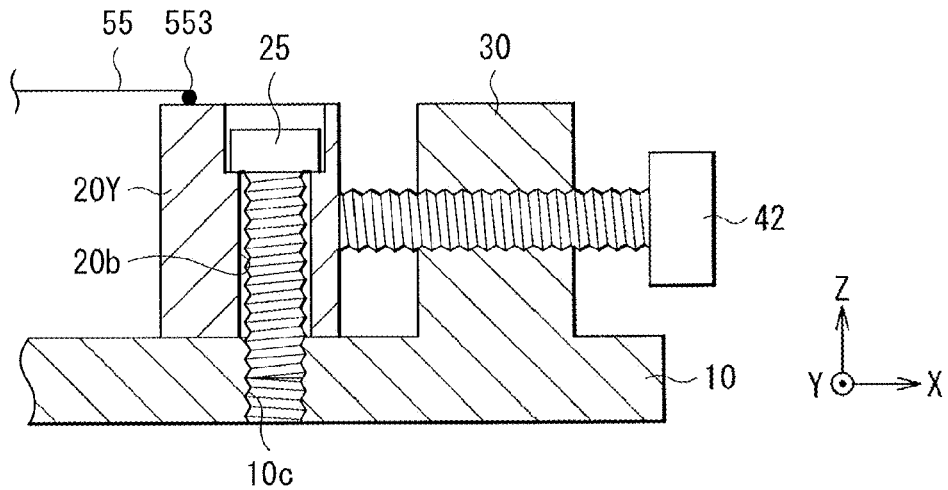
FIG. 7A is a cross-sectional view showing an example of a fixing mechanism of a movable member.

In an example illustrated in FIG. 7A, in such a manner that a fixing bolt 25 is inserted into an insert hole 20b from the top surface side of the movable member 20Y, and is fixed into a screw hole 10c of the base frame 10, the movable member 20Y is fixed to the base frame 10. The insert hole 20b is sized to ensure that the screw hole 10c is not covered with the movable member 20Y even though the movable member 20Y moves along the X-axis direction for the positional adjustment of the mask patterns.

Figure 7B:
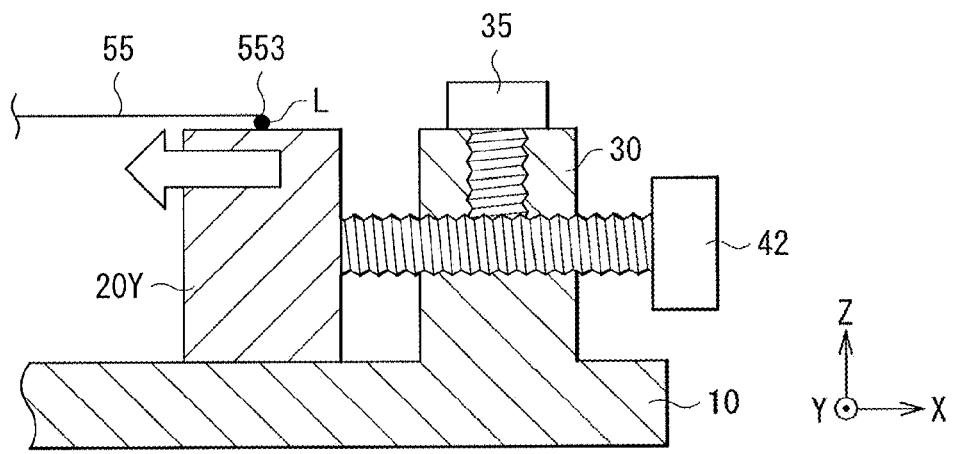
FIG. 7B is a cross-sectional view showing an example of the fixing mechanism of the movable member.

In an example illustrated in FIG. 7B, the push bolt 42 is fixed by a locking screw 35 from the top surface side of the supporting member 30. Similarly, the pull bolt 41 is also fixed by a locking screw, which is not shown in the drawing.

Figure 7C:
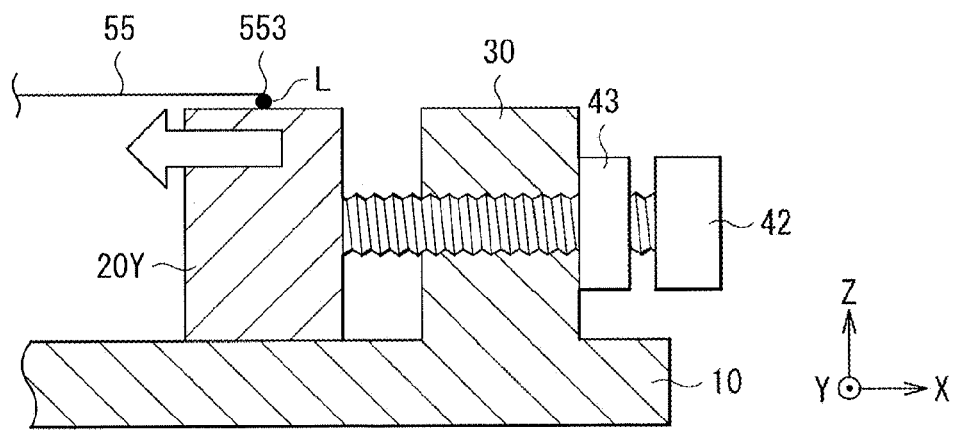
FIG. 7C is a cross-sectional view showing an example of the fixing mechanism of the movable member.

In an example illustrated in FIG. 7C, for instance, a nut 43 is fixed to the push bolt 42. Similarly, a nut is also fixed to the pull bolt 41, which is not shown in the drawing.

It is to be noted that a corner rounding treatment or a step machining treatment may be performed on edges of the movable members 20X and 20Y. This is because such a treatment makes it possible to prevent the edges from getting stuck with the base frame 10 in shifting the movable members 20X and 20Y. Further, a treatment to reduce a friction resistance may be carried out on portions of the movable members 20X and 20Y that slidably come in contact with the base frame 10.

Figure 8A:
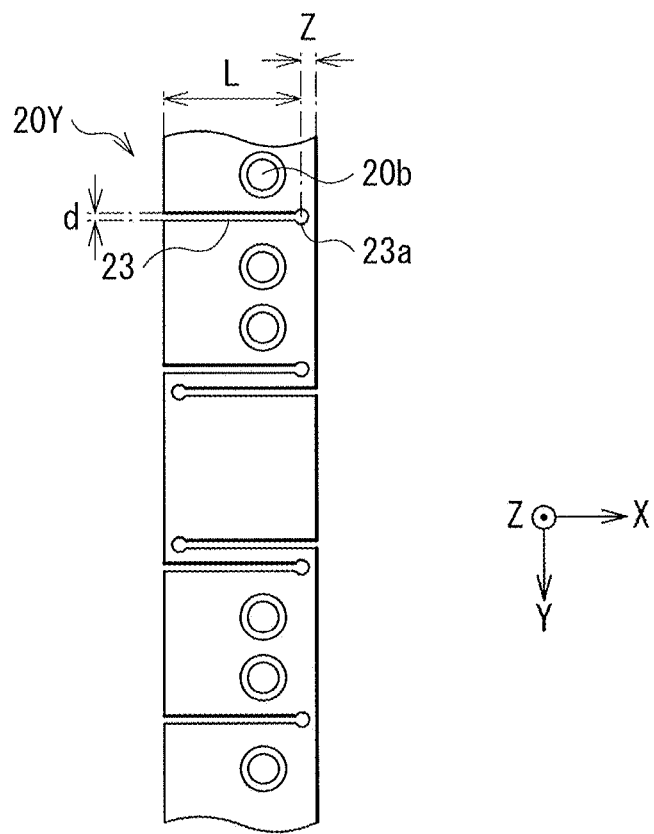
FIG. 8A is an X-Y enlarged plan view of the movable member.
Figure 8B:
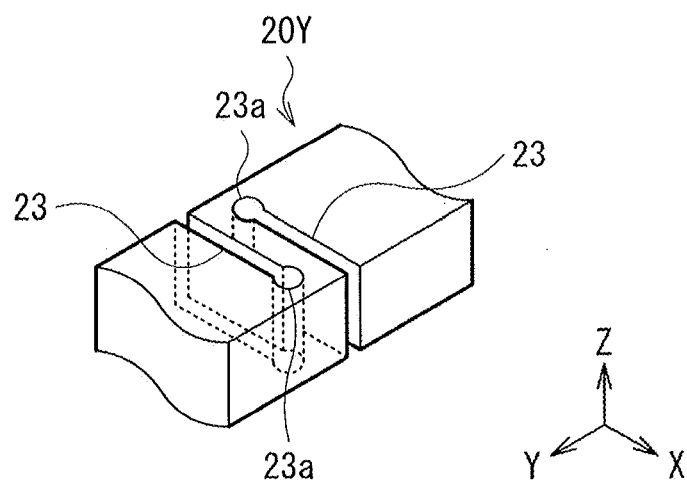
FIG. 8B is an enlarged perspective view of the movable member.

Each of FIG. 8A and FIG. 8B shows a detailed configuration of the movable member (the movable member 20Y is here taken as an example). In the evaporation mask 1, slits 23 are formed at selective regions of the movable members 20X and 20Y as mentioned above. The slit 23 may be, for example, provided to extend along the width direction (X-axis direction) of the movable member 20Y. One or more slits 23 may be provided within a selective region A illustrated in FIG. 3B, for example. More specifically, the slits 23 are provided on both sides in the X-axis direction (in a state of being open to two side surfaces). The screw hole 20b that configures the fixing mechanism of the movable member 20Y is disposed at a region between the slits 23 (the slits 23 are formed to avoid mounting locations of the fixing bolt 25 (screw hole 20b) and others (fixing mechanism). Further, at an end of the slit 23, a hole 23a is formed to communicate with the slit 23.

It is possible to set a width "d" of the slit 23 to a value within a range of about 1 to 10 mm, for example. However, to assure a space for welding with the mask body 55 and a mounting space of the fixing mechanism, the width "d" may be preferably as small as possible. Further, a distance (width) "Z" between the hole 23a and the side surface of the movable member 20Y (Z=(width of the movable member)−(length L of the slit)) may be, for example, within a range of about 0.5 to 2 mm. An X-Y planar shape of the hole 23a may be, for example, a circular form, and a diameter thereof may be, for example, within a range of about 2 to 5 mm, which is larger than the width "d" of the slit 23. The diameter of the hole 23a may be also preferably designed to be as small as possible in consideration of a welding space and other factors.

(Mask Manufacturing Method and Positional Adjusting Method)

Figure 9:
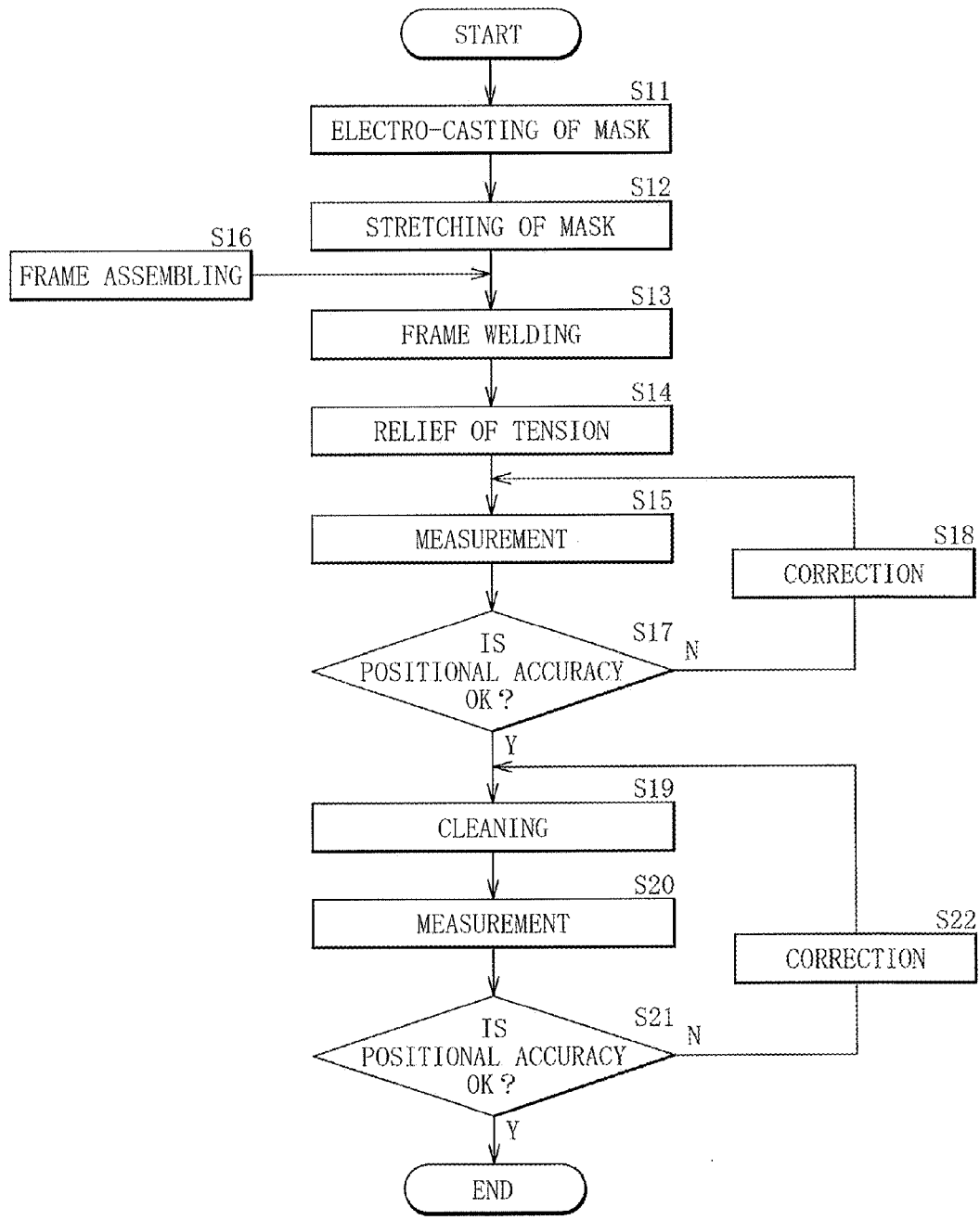
FIG. 9 is a flowchart showing a flow of a method of manufacturing the evaporation mask illustrated in FIG. 1.

The evaporation mask 1 having the adjusting frame 50 as described above may be manufactured, and positions of the passage holes 55a may be adjusted (corrected) in the following manner, for example. FIG. 9 shows a flow of each process for manufacturing, cleaning, and positional adjustment of the evaporation mask 1. Each of FIG. 10A to FIG. 10E schematically shows each process. As illustrated in the drawings, to start with, the mask body 55 including the pattern regions 552 that are configured of the predetermined passage holes 55a is formed using, for example, an electrocasting process (step S11, FIG. 10A). Subsequently, the formed mask body 55 is stretched (a predetermined tension T is applied) (step S12, FIG. 10B). In the meantime, the adjusting frame 50 is prepared. Alternatively, in case of necessity, the adjusting frame 50 is assembled (step S16).

Figure 10A:
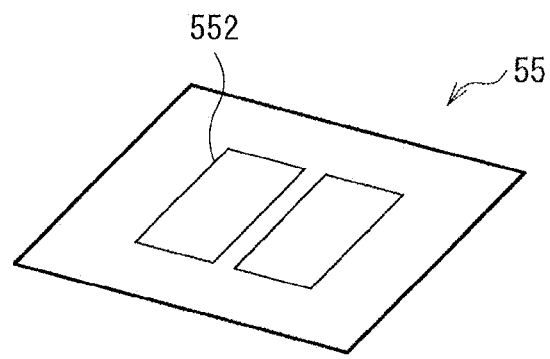
FIG. 10A is a schematic diagram for explaining the method of manufacturing the evaporation mask illustrated in FIG. 1 in order of manufacturing processes.
Figure 10B:
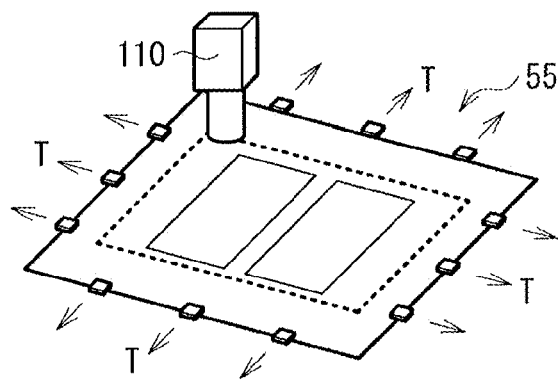
FIG. 10B is a schematic diagram showing a manufacturing process following on the manufacturing process shown in FIG. 10A.
Figure 10C:
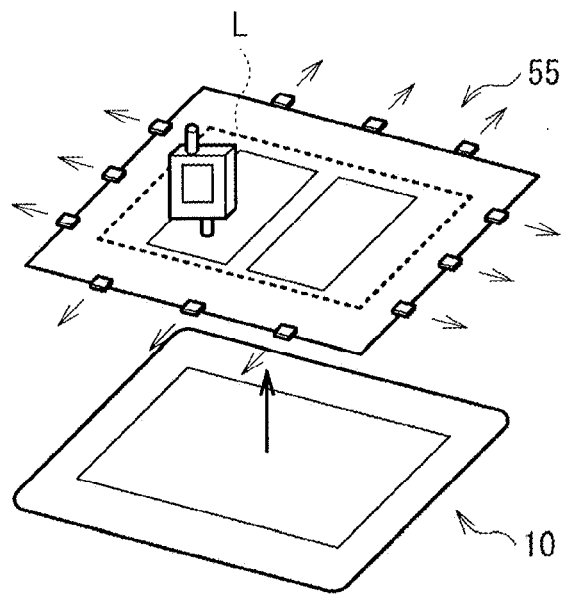
FIG. 10C is a schematic diagram showing a manufacturing process following on the manufacturing process shown in FIG. 10B.
Figure 10D:
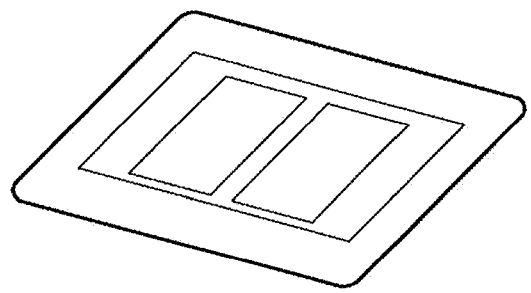
FIG. 10D is a schematic diagram showing a manufacturing process following on the manufacturing process shown in FIG. 10C.

Thereafter, welded fixing of the mask body 55 to the adjusting frame 50 is carried out with tension applied to the mask body 55 (step S13, FIG. 10C). At this time, the mask body 55 and the movable members 20X and 20Y of the adjusting frame 50 are bonded with each other via a welding point L. Upon completion of welding, the tension applied to the mask body 55 is relieved (step S14, FIG. 10D). Such a process fixes the mask body 55 to the adjusting frame 50.

Figure 10E:
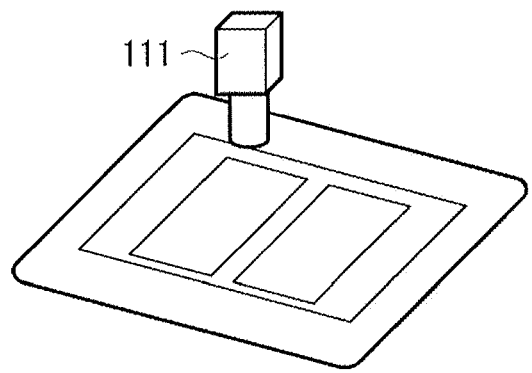
FIG. 10E is a schematic diagram showing a manufacturing process following on the manufacturing process shown in FIG. 10D.

Subsequently, formed pattern regions 552 (positions of the passage holes 55a) are measured with a camera 111 (step S15, FIG. 10E). Thereafter, it is determined whether the positional accuracy of the passage holes 55a is within the allowable range (step S17), and if the positional accuracy is insufficient (N at step S17), the positions of the passage holes 55a are adjusted (corrected) (step S18). This step of adjusting (correcting) the passage holes 55a is hereinafter described. After the correction is completed in the step S18, the process is returned back to the step S15 again.

On the other hand, if the sufficient positional accuracy is obtained (Y at step S17), the evaporation mask 1 is used for a vapor deposition process. At the end of the vapor deposition process, the evaporation mask 1 is cleaned (step S19), and thereafter the measurement (step S20) and the determination of the positional accuracy (step S21) that are similar to the above are carried out. If the positional accuracy is insufficient (N at step S21), the positions of the passage holes 55a are adjusted (modified) (step S22). If the positional accuracy is sufficient (Y at step S21), positional adjustment of the mask is ended.

(Details of Positional Adjustment)

In the first embodiment of the present disclosure, as described above, the adjusting frame 50 is provided with the movable members 20X and 20Y as well as the adjusting mechanism 40, thus allowing the positions of the passage holes 55a to be adjusted after welded fixing of the mask body 55 to the frame (steps S18 and S22). On this occasion, the slit 23 is provided at the selective region A of the movable member 20Y, for example, which makes it possible to locally adjust the positions of the passage holes 55a.

Figure 11:
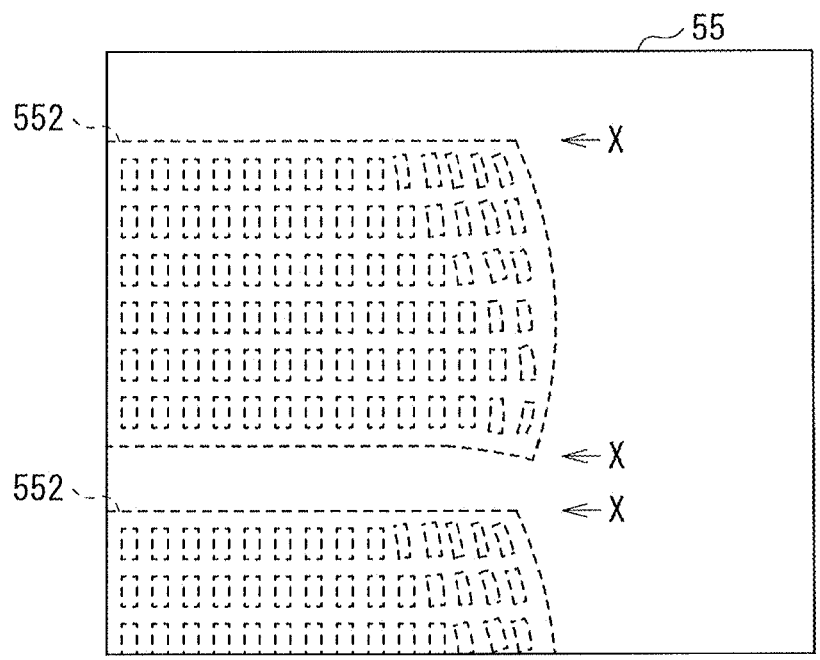
FIG. 11 is a schematic diagram for explaining local positional displacement.
Figure 12:
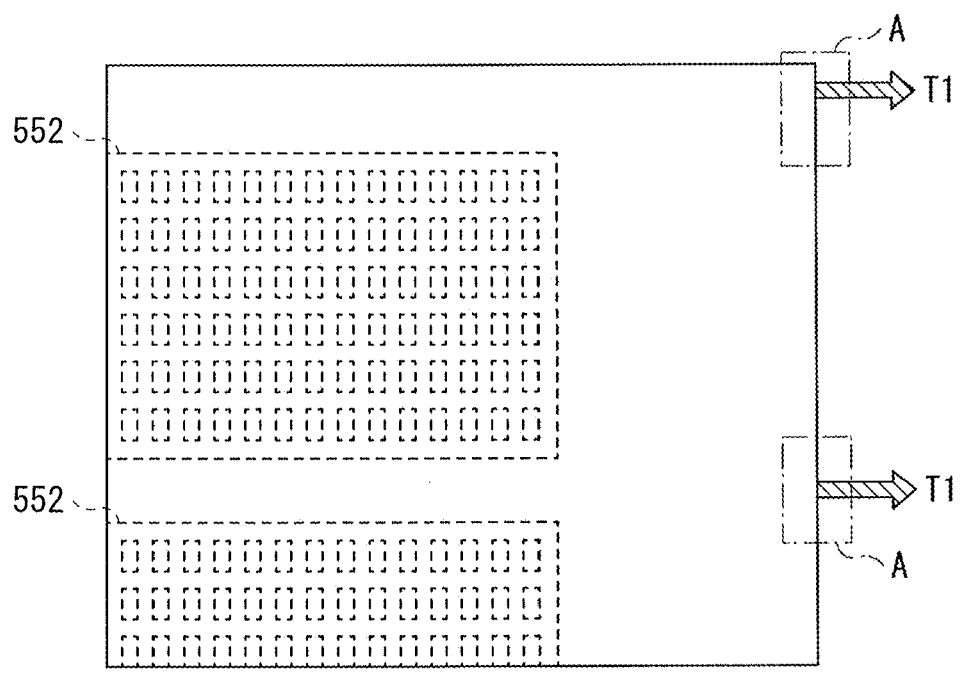
FIG. 12 is a schematic diagram for explaining local positional adjustment.

Here, FIG. 11 schematically shows an enlarged view of a part of the mask body 55 after welded fixing to the frame. As illustrated in the drawing, in the mask body 55, a positional displacement of the passage holes 55a (X in FIG. 11) may occur more easily in the proximity of corners (four rectangular corners) of the pattern regions 552 than in any other part. This is because there is a difference in the rigidity between a formation region and a non-formation region of the passage holes 55a. Further, it is more likely that a positional displacement that is caused due to such a difference in the rigidity will occur especially when tension is relieved. Although an occurrence location of such a local positional displacement X is identified with ease, there may be variations in the displacement amount, and thus it is difficult to estimate such a displacement amount preliminarily. To adjust the positional displacement X, it is desired to apply tension T1 corresponding to the displacement amount to the selective region A as shown in FIG. 12.

Figure 13:
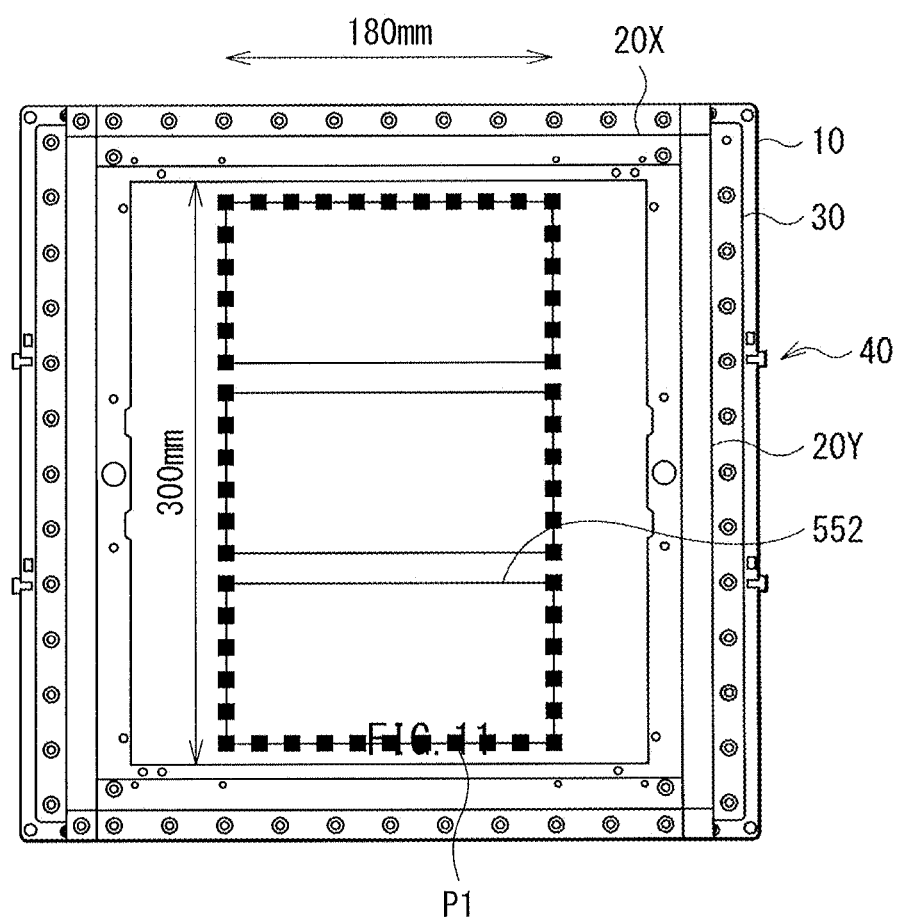
FIG. 13 is an X-Y plan view of the evaporation mask that is used for simulation.
Figure 14:
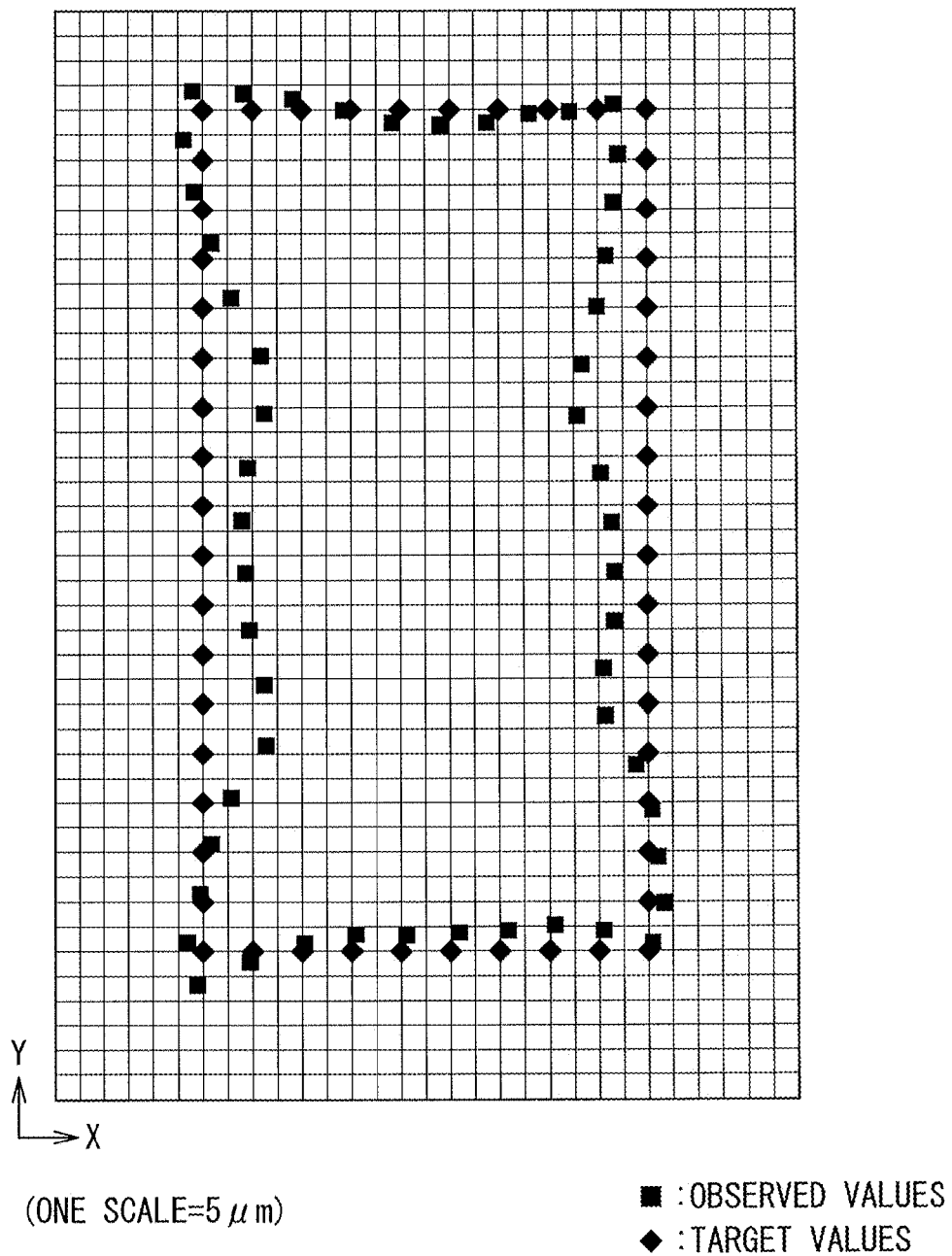
FIG. 14 is a characteristic diagram showing a simulation result prior to positional adjustment.
Figure 15:
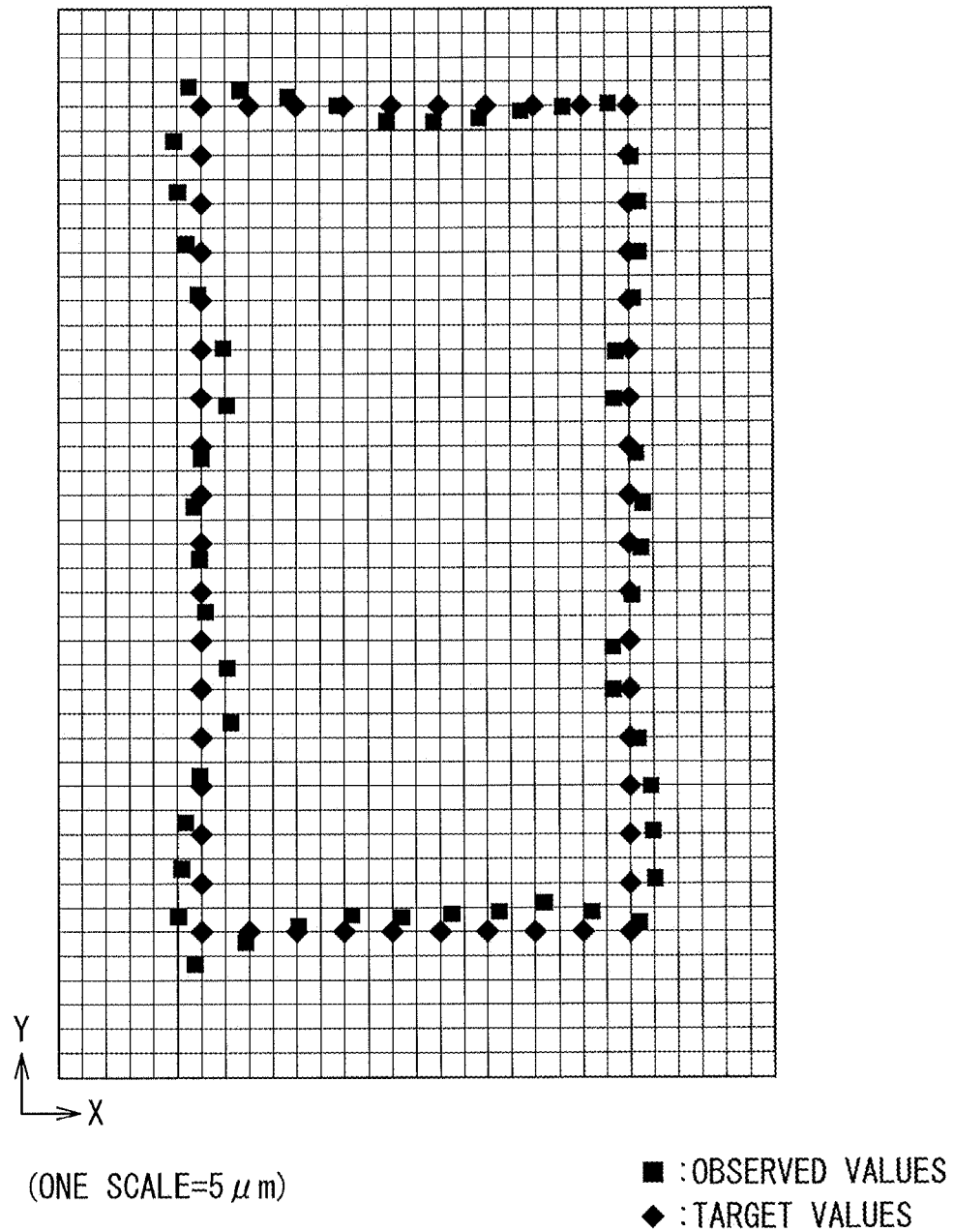
FIG. 15 is a characteristic diagram showing a simulation result after positional adjustment of whole sides of the movable member.
Figure 16:
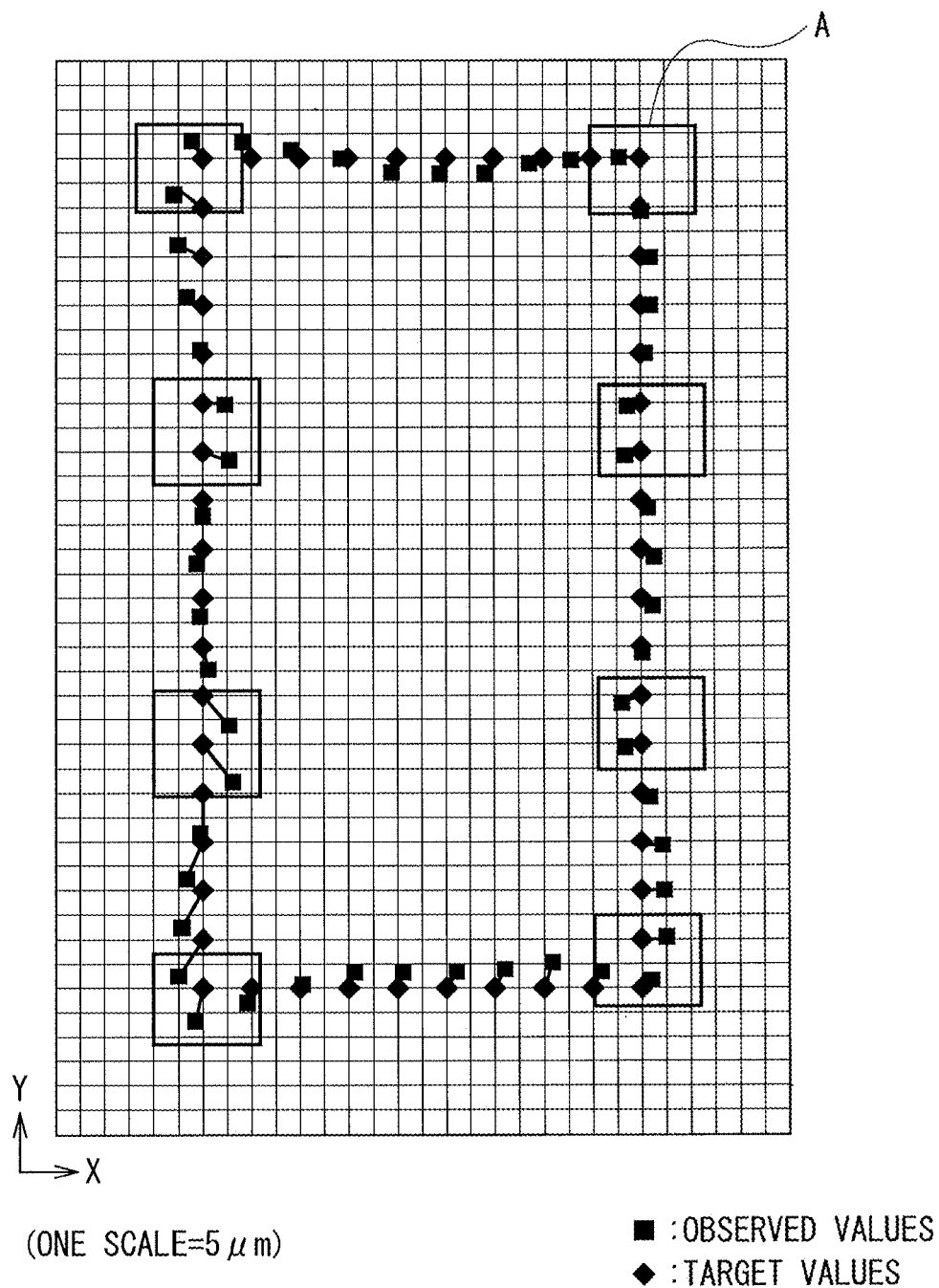
FIG. 16 is a characteristic diagram showing a simulation result after positional adjustment of whole sides of the movable member.

Hereinafter, simulation results are presented. FIG. 13 shows an X-Y planar configuration of the evaporation mask 1 that is used for simulation. Measurement was made for a position of each point p1 on an outer edge (about 180 mm×300 mm) of a formation region in the 1×3 pattern regions 552. FIG. 14 shows positions of the measuring points p1 prior to the positional adjustment after welded fixing to the frame (after relief of tension). Relative to target values (original positions of the passage holes 55a without any positional displacement), observed values indicated that the positional displacement occurred in such a manner that the observed values formed a line shape which was recessed toward the inner side in whole, and the displacement amount was within the range of about −16 to +16 μm. On the other hand, FIG. 15 shows positions of the measuring points p1 after the positional adjustment is carried out for the positional displacement illustrated in FIG. 14 by wholly shifting each side of the movable members 20X and 20Y with use of the adjusting mechanism 40. Although this allows the displacement amount to be suppressed down to a value within the range of about −8 to +8 μm, it is difficult to resolve a local positional displacement arising at the region A corresponding to the corners of the pattern regions 552 (FIG. 16), and thus the improvement is desired.

Figure 17:
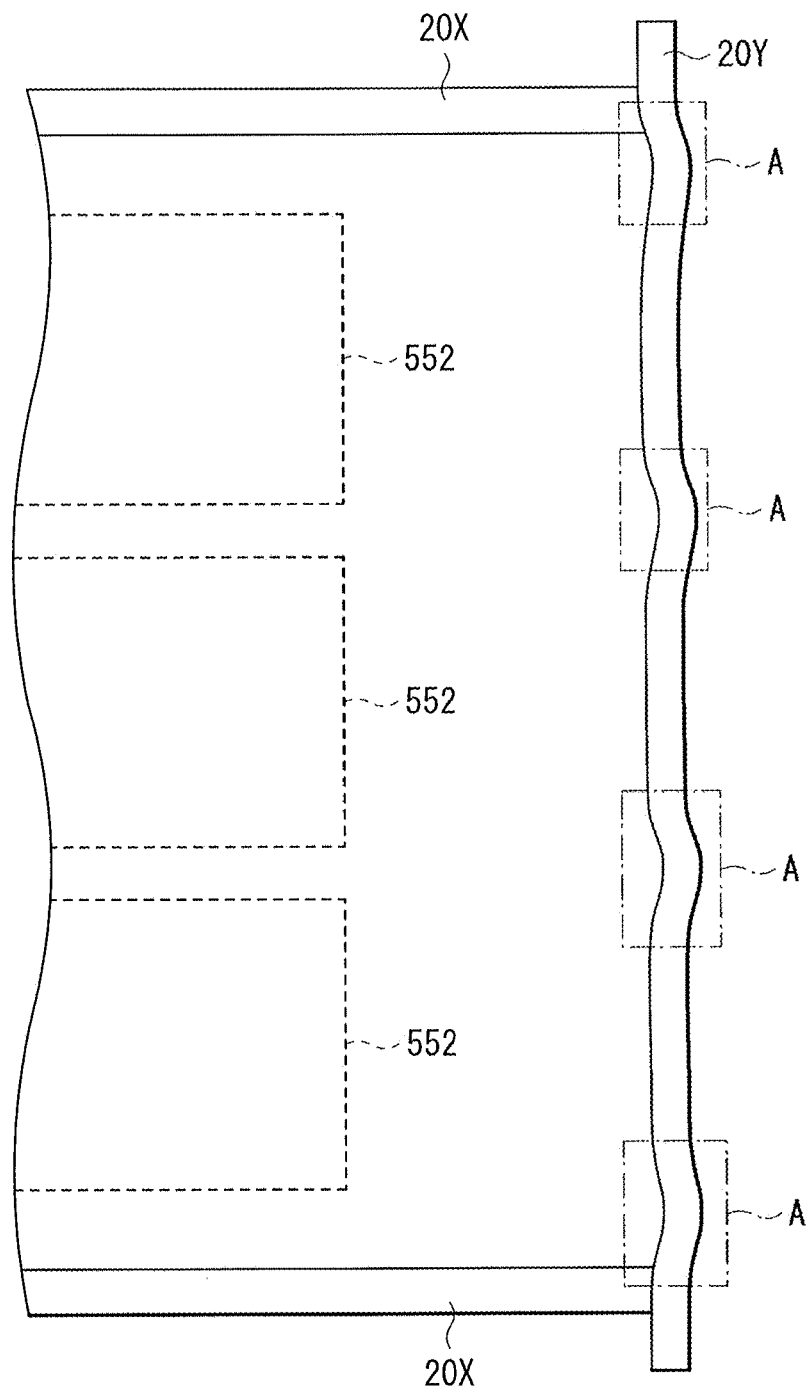
FIG. 17 is a schematic diagram for explaining local positional adjustment.

Accordingly, in the first embodiment of the present disclosure, the provision of the slit 23 on the region A of the movable member 20Y allows the movable member 20Y to be locally deformed (shifted) with ease as shown in FIG. 17. This is due to the following reason. With reference to each of FIG. 18A to FIG. 18C, the description is provided on the action in the proximity of the region A. It is to be noted that arrows in each of FIG. 18A to FIG. 18C schematically show directions of forces to be applied for adjustment, and indicate that force id applied to the vicinity of a center of the region A and each portion above and below such a region in the directions in opposition to each other to produce the local deformation of the movable member 20Y as illustrated in the right-side drawing in FIG. 18A.

Figure 18A:
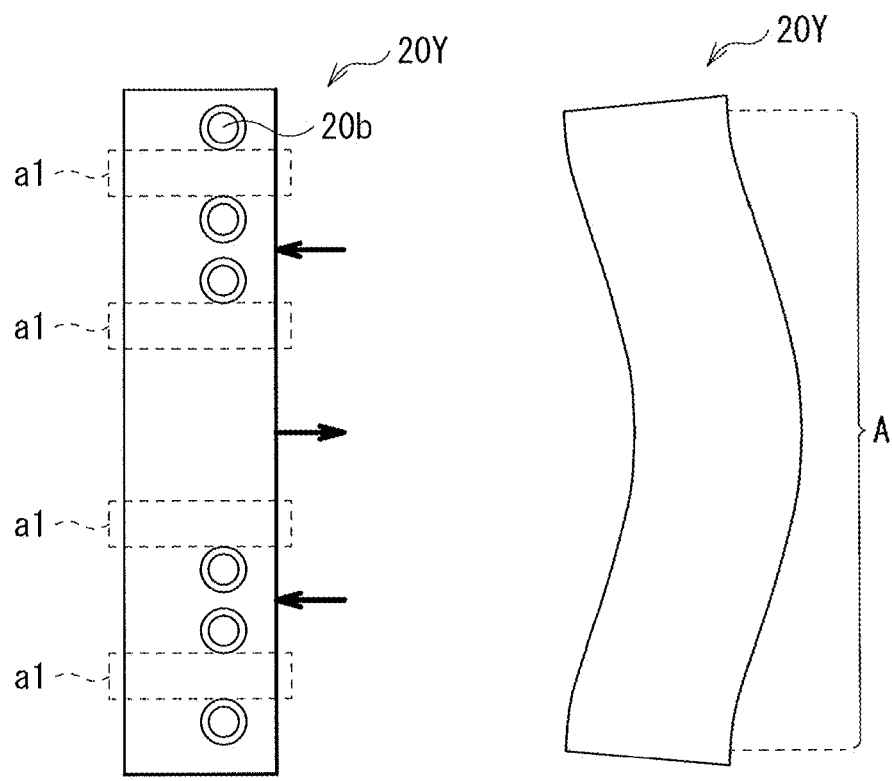
FIG. 18A is a schematic diagram for explaining details of the local positional adjustment.

In other words, in shifting the movable member 20Y locally (right-side drawing in FIG. 18A), compressive or tensile stresses concentrate on regions a1 (left-side drawing in FIG. 18A). Therefore, as shown in FIG. 18B, it is possible to alleviate concentration of the stresses on the regions a1 as described above by adding the slits 23 to the movable member 20Y.

Figure 18B:
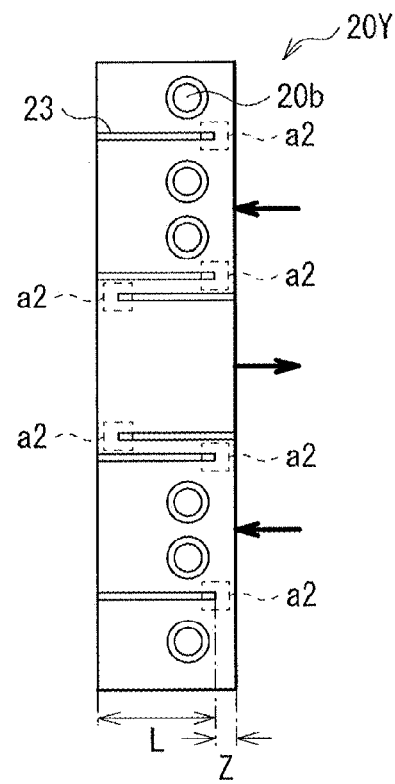
FIG. 18B is a schematic diagram for explaining details of the local positional adjustment.
Figure 18C:
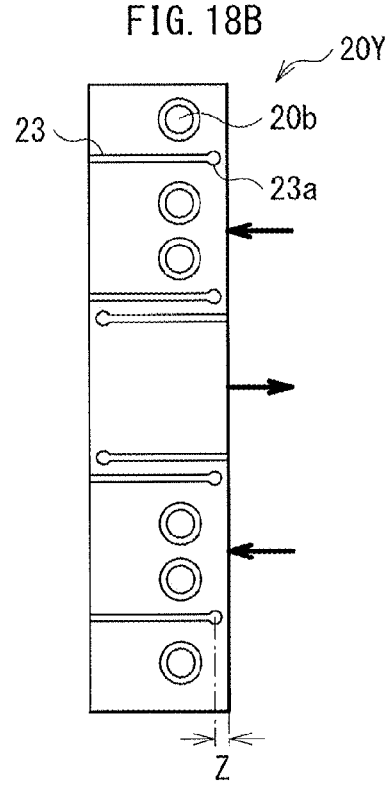
FIG. 18C is a schematic diagram for explaining details of the local positional adjustment.

On the other hand, when the slits 23 are added, stresses concentrate on ends (regions a2) of the slits 23 (FIG. 18B). Therefore, if a length L of the slit 23 is made too large, this may often cause the movable member 20Y to be broken. On the contrary, if the length L of the slit 23 is too small, force that is necessitated for deformation of the movable member 20Y may increase. Accordingly, as shown in FIG. 18C, the hole 23a is added to the end of the slit 23. This makes it possible to suppress concentration of stresses on the end of the slit 23. As a result, it is possible to set up the distance Z to the above-described value (within the range of about 0.5 to 2 mm) without breaking the movable member 20Y, and to form the slit 23 with a sufficient length.

For the reason as described above, by providing the slits 23 and the holes 23a on the movable member 20Y, it is possible to reduce force (for example, axial force of a bolt) that is necessitated for local deformation of the movable member 20Y as compared with a case where the slits 23 and the holes 23a are not provided. As shown in FIG. 12, this allows a local positional displacement to be corrected by applying the tension T1 corresponding to the displacement amount to the region A.

For example, if a diameter of the hole 23a is about 3 mm, and the distance Z is about 1 mm, it is possible to reduce axial force of a bolt down to about a tenth part or less. More specifically, in adjusting local positional displacement of about 10 μm for the passage holes 55a, when a width of the movable member 20Y is about 16 mm, it is necessary to shift the movable member 20Y by about 80 μm within a region of about 20 mm in width. Here, although it is possible to reduce the axial force that is necessitated for adjustment by decreasing the width (length along the X-axis direction) of the movable member 20Y, there is a limitation in reduction of the width because it is necessary to assure a welding space or a space for the fixing mechanism. Further, it is also possible to reduce the above-described axial force by changing a material for the movable member 20Y into a material having the lower Young's modulus. However, since welding has to be performed, and a small difference in the thermal expansion coefficient between the movable member 20Y and a substrate to be evaporated is desired, it is difficult to use resin, aluminum, and the like as a material for the movable member 20Y. As a material for the movable member 20Y, it may be preferable to use a material such as SUS and inver in terms of the thermal expansion coefficient as described above. Therefore, if the movable member 20Y is provided with no slits 23, the axial force of a bolt that is necessitated may become about one ton, leading to the adjusting mechanism being configured on a large scale. In the first embodiment of the present disclosure, the provision of the slits 23 and the holes 23a allows such axial force of a bolt to be reduced significantly, and the use of the above-described adjusting mechanism 40 (pull bolt 41 and push bolt 42) makes it possible to facilitate the local positional adjustment.

Further, by adding the slits 23 to the movable member 20Y, although the rigidity of the movable member 20Y itself is deteriorated, the movable member 20Y is fixed by the fixing mechanisms as shown, for example, in FIG. 7A to FIG. 7C after the positional adjustment is completed, thus allowing the sufficient rigidity to be maintained as the evaporation mask 1.

Especially when two or more pattern regions 552 are formed along one or both of the X-axis direction and the Y-axis direction of the mask body 55 (in a case of multiple chamfering), occurrence locations of the local positional displacement X increase in number, and thus an advantage of provision of the slits 23 becomes significant. This makes it possible to meet the needs for further improvement of the productivity, reduction of manufacturing costs, and the like. Further, although the description is here provided on a case where an X-Y arrangement of the pattern regions 552 is 1×3, the arrangement is not limited to such a configuration, and the pattern regions 552 are widely applicable in a case where the X-Y arrangement is m×n (m and n are each an integer of 1 or more). In addition, the slits 23 may be provided on all the movable members 20X and 20Y, or may be provided only on the movable member (20X or 20Y) in the selective axial direction. However, it is effective to provide the slits 23 on the movable member (the movable member 20Y in the first embodiment) that extends along the axial direction where the local positional displacement may occur more often.

As described thus far, in the first embodiment, there are provided the mask body 55 including the pattern regions 552 that are configured of the plurality of passage holes 55a, and the adjusting frame 50 having a mechanism capable of adjusting the positions of the passage holes 55a while holding the mask body 55. In the adjusting frame 50, the movable members 20X and 20Y are provided along each side of the base frame 10, and the outer edge 553 of the mask body 55 is bonded with the movable members 20X and 20Y. Since the plurality of slits 23 are provided on selective regions of these movable members 20X and 20Y (for example, the region A of the movable member 20Y), it is possible to locally adjust the positions of the passage holes 55a on the mask body 55, resulting in the positions of the passage holes 55a being adjustable quite finely. This allows the positional accuracy of the mask patterns to be improved.

Further, by adopting a structure in which the slits 23 are added to the movable member, it is possible to carry out the above-described local adjustment while maintaining the design (stress relief region, testing aperture, and the like) of the mask body 55.

In addition, it is also possible to correct internally residual distortion arising in an electro-casting treatment in a mask manufacturing process, or accuracy deterioration arising with deterioration in the positional accuracy for each of photoetching processes. Further, it is possible to suppress occurrence of an out-of-specification issue with the positional accuracy of the mask patterns in the mask manufacturing process, leading to the yield improvement in the manufacturing. Moreover, even if positions of the mask patterns are shifted through a cleaning process and the like after the evaporation mask 1 is used for a vapor deposition process as described hereinafter, it is possible to correct such a positional displacement according to the first embodiment. This also contributes to lifetime extension of a mask apparatus.

Moreover, in an organic EL display unit to be hereinafter described, there is a trade-off relationship between an aperture ratio and a degree of image-quality definition. The use of the evaporation mask 1 according to the first embodiment in a manufacturing process improves the positional accuracy of the passage holes, thus making it possible to achieve a high-aperture-ratio and high-definition display device beyond a limiting line of the above-described trade-off. An increase in the aperture ratio means that higher luminance and longer lifetime of the organic EL display device are achieved.

Hereinafter, the description is provided on evaporation masks according to other embodiments (second to fourth embodiments) of the present disclosure. It is to be noted that any component parts essentially same as those of the evaporation mask 1 according to the above-described first embodiment are denoted with the same reference numerals, and the related descriptions are omitted as appropriate.

Second Embodiment

Figure 19:
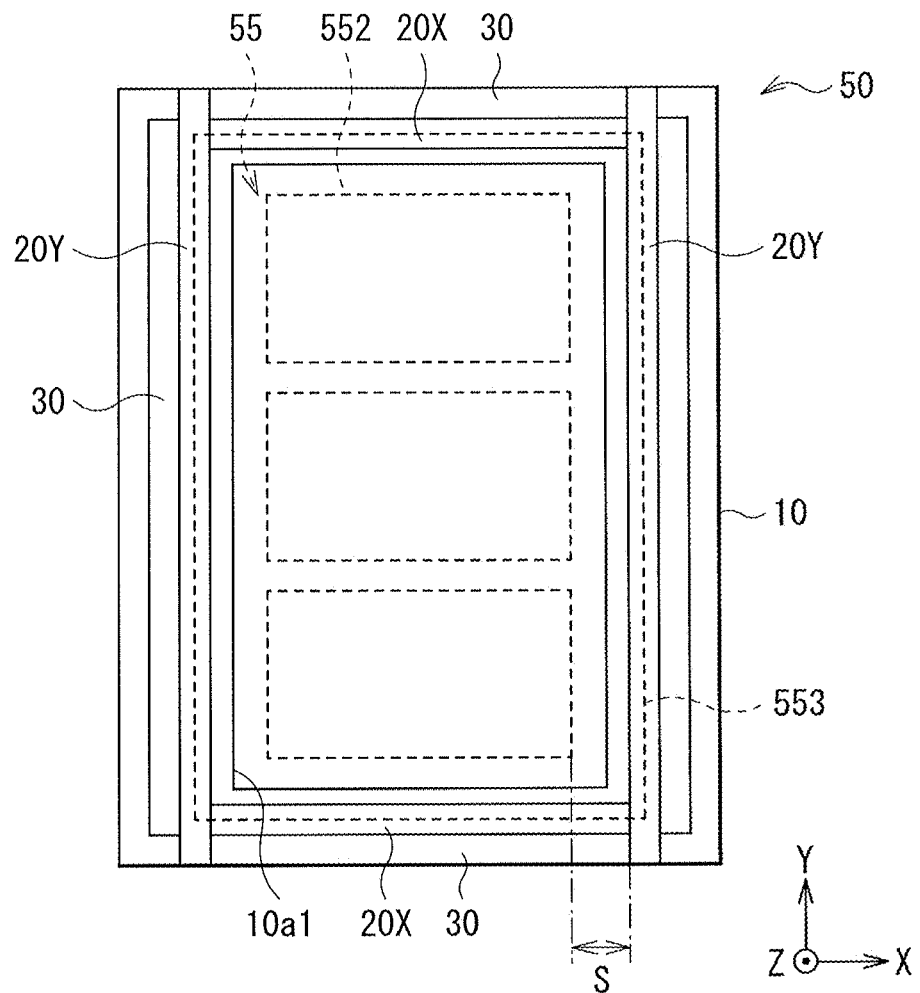
FIG. 19 is an X-Y plan view of an evaporation mask according to a second embodiment of the present disclosure.

FIG. 19 is an X-Y plan view of an evaporation mask according to a second embodiment of the present disclosure. In this regard, a mask body 55 is denoted with a dashed line.

As is the case with the above-described first embodiment, the evaporation mask according to the second embodiment may be also used in a manufacturing process of a display unit using organic EL devices, for example. This evaporation mask may include, for example, the mask body 55, and an adjusting frame 50 that holds the mask body 55 and has a predetermined positional adjustment function. The adjusting frame 50 includes movable members 20X and 20Y as well as a supporting member 30 on a base frame 10, and has an adjusting mechanism 40.

In the above-described first embodiment, the local positional adjustment of the passage holes is carried out by providing the slits 23 on the movable member 20Y. In the second embodiment, however, the description is provided on a mask configuration that makes it possible to achieve the same local positional adjustment as above without providing the slits 23.

In concrete terms, in the second embodiment, one or both of the movable members 20X and 20Y are disposed in the proximity of pattern regions 552 (is arranged closer to the pattern regions 552). Here, a configuration is made in such a manner that the movable member 20Y is located closer to the pattern regions 552 as compared with a case of the above-described first embodiment. The second embodiment differs from the above-described first embodiment in that the movable member 20Y does not have the slits 23 and holes 23a, and that a distance "s" between the movable member 20Y (more specifically, a welding point) and an end of the pattern region 552 is designed to be a predetermined value or less.

Figure 20:
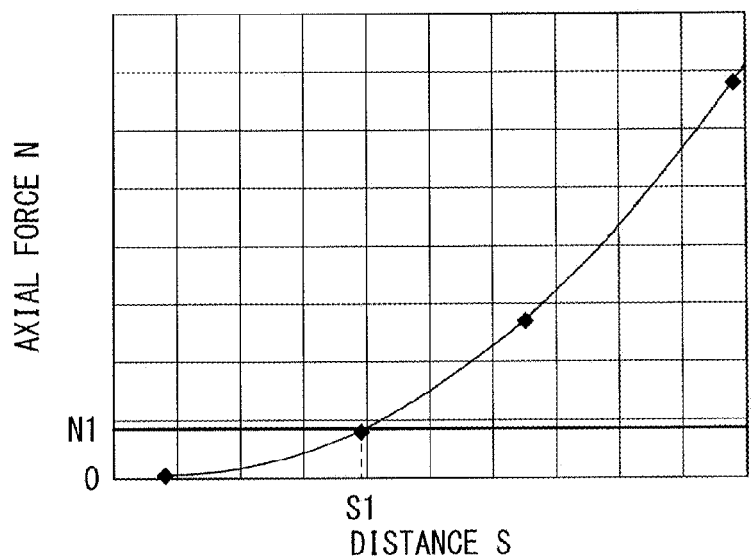
FIG. 20 is a characteristic diagram showing a relationship between a distance from a movable member to a pattern region and an axial force.

FIG. 20 shows an example of a relationship between the distance "s" and the axial force N that is exerted by a bolt. As seen from the drawing, in any case where whatever kind of bolt is used, there is a correlation between the axial force N thereof and the distance "s", and thus it is possible to set up an optimum distance (s1) from axial force (N1) that is necessitated for the local positional adjustment.

In such a manner, in the second embodiment, it is possible to achieve the local positional adjustment using smaller axial force by properly setting up a position of the movable member 20Y in the X-axis direction in accordance with necessary axial force. In other words, proper setting of the distance "s" makes it possible to control axial force necessary for carrying out the local positional adjustment.

Figure 21:
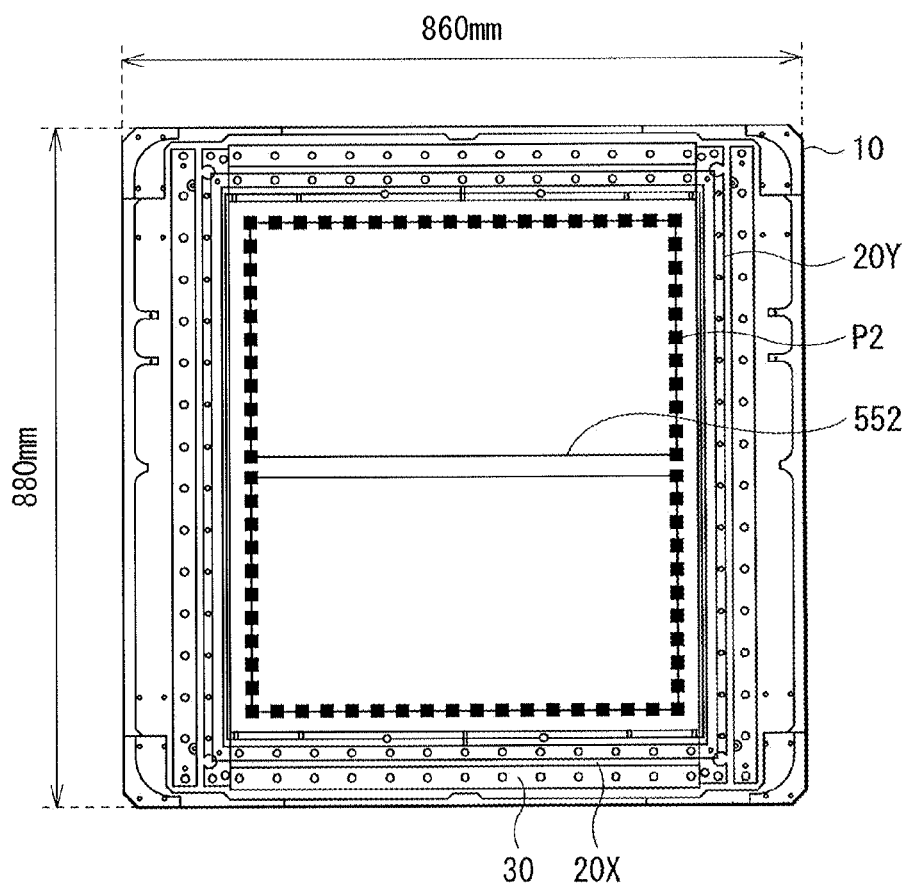
FIG. 21 is an X-Y plan view of the evaporation mask that is used for simulation.
Figure 22:
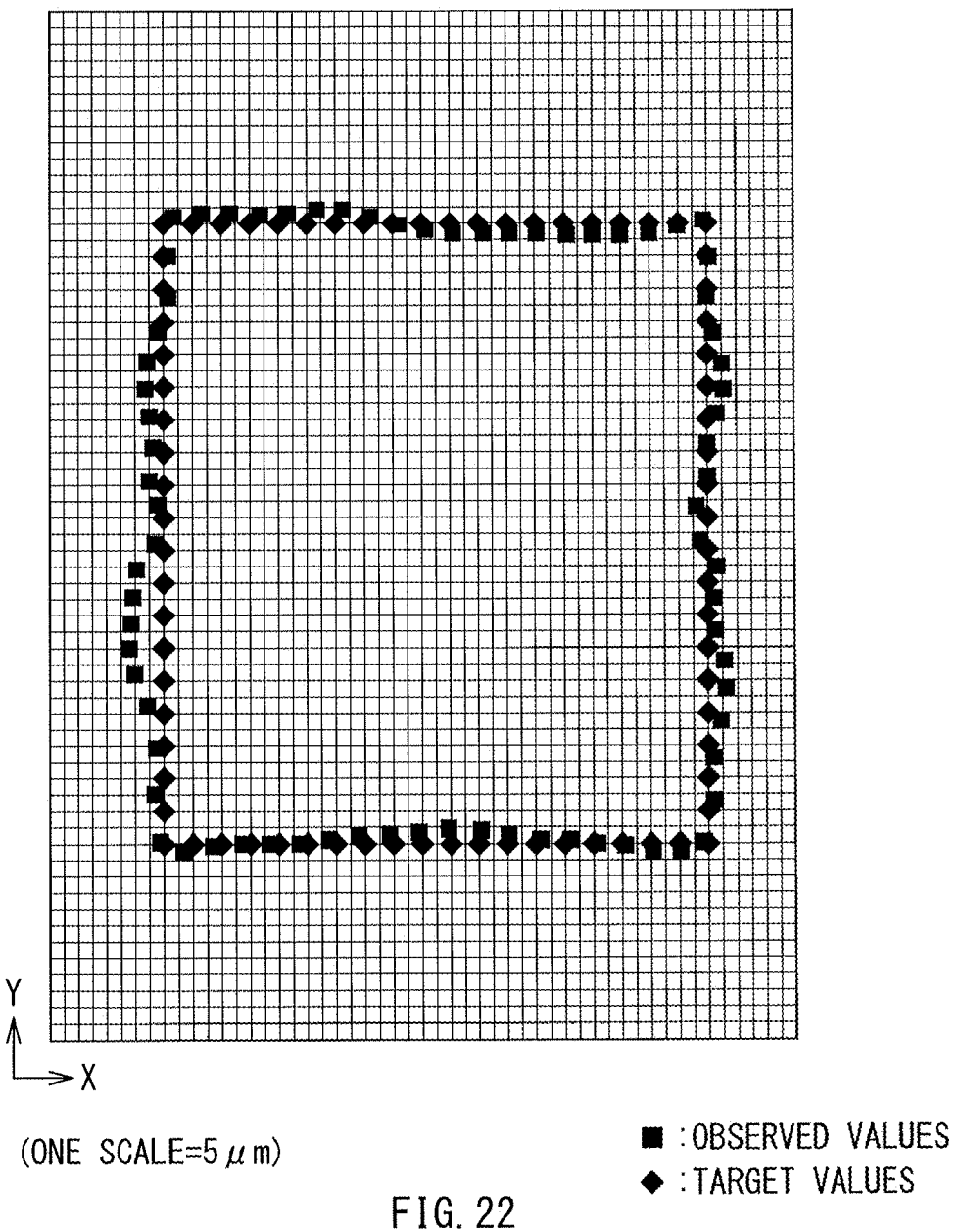
FIG. 22 is a characteristic diagram showing a simulation result before local positional adjustment in the evaporation mask illustrated in FIG. 21.
Figure 23:
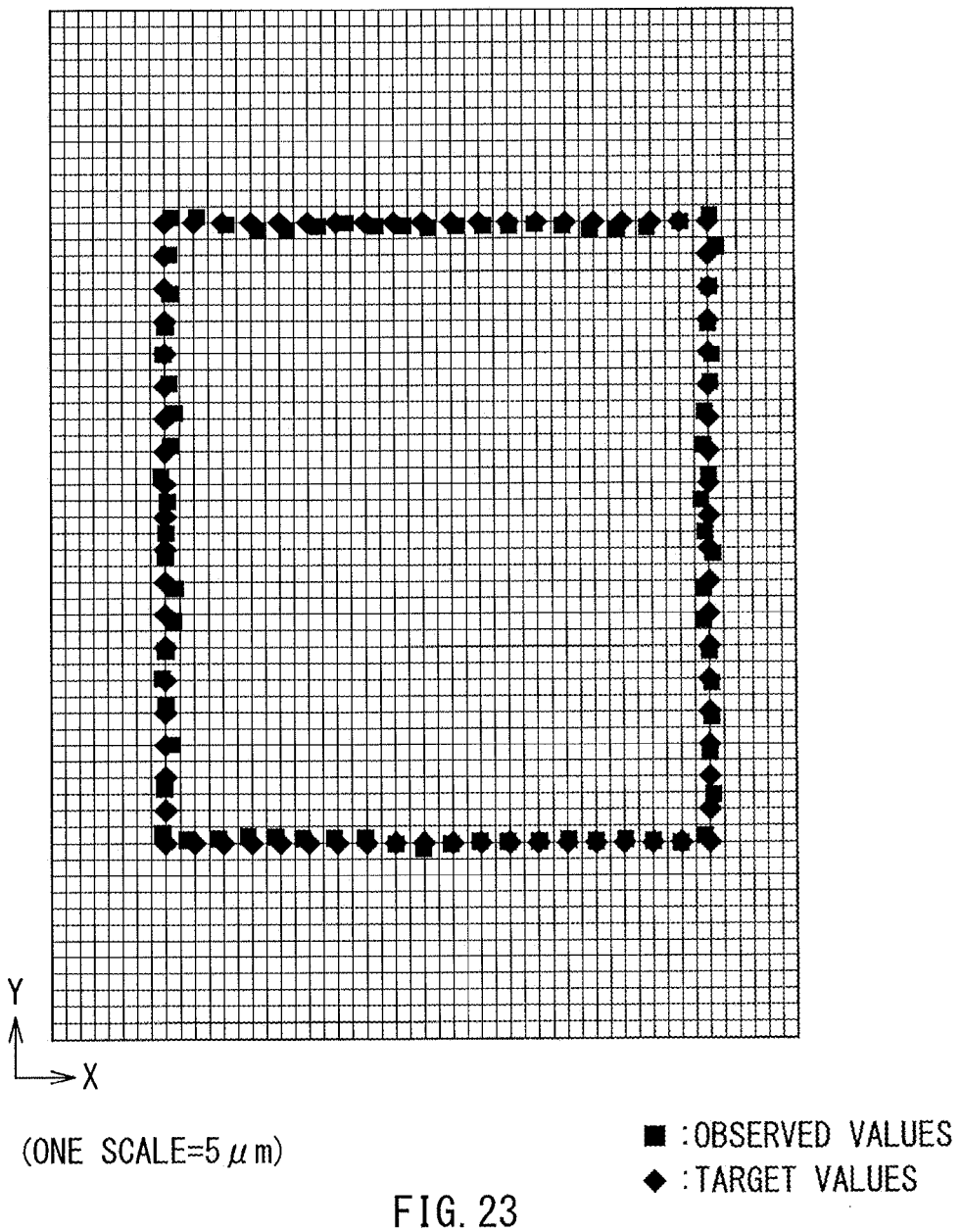
FIG. 23 is a characteristic diagram showing a simulation result after the local positional adjustment in the evaporation mask illustrated in FIG. 21.

Hereinafter, simulation results of the second embodiment are presented. FIG. 21 shows an X-Y planar configuration of the evaporation mask that is used for simulation. The base frame 10 having an aperture 10a of about 900 mm×900 mm in size was used, and the mask body 55 in which the 1×2 pattern regions 552 are formed on a foil made of inver with a thickness of about 12 mm was used. Further, the distance "s" between the movable member 20Y and the pattern region 552 was set at about 30 mm. In such mask patterns, measurement was made for a position of each point p2 on an outer edge of a formation region in the 1×2 pattern regions 552. FIG. 22 shows positions of the measuring points p2 prior to the local positional adjustment after welded fixing to the frame (after relief of tension). Relative to target values, observed values indicated that the positional displacement occurred in a local region, and the displacement amount (maximum value) was within the range of about −13 to +13 µm in the X-axis direction, and within the range of about −6 to +6 µm in the Y-axis direction. On the other hand, FIG. 23 shows positions of the measuring points p2 after the local positional adjustment is carried out for the positional displacement illustrated in FIG. 22. This allowed the displacement amount to be suppressed down to a value within the range of about −3 to +3 µm in the X-axis direction, and a value within the range of about −2 to +2 µm in the Y-axis direction.

As described above, in the second embodiment, in the adjusting frame 50 having a mechanism capable of adjusting the positions of the passage holes on the mask body 55, the movable member (for example, the movable member 20Y) that is provided along one or more sides of the base frame 10 is located in the proximity of the pattern regions 552. This allows the positions of the passage holes on the mask body 55 to be adjusted locally, leading to the positions of the passage holes 55a being adjustable quite finely. As a result, this makes it possible to achieve the effects equivalent to those of the above-described first embodiment.

In the above-described first and second embodiments, two different methods are described as a method of locally adjusting the positions of the passage holes 55a, and these methods may be used separately from each other, or may be used in combination with each other. For example, there may be a case where it is difficult to apply the method of optimizing a distance between the movable member and an end of the pattern region as mentioned in the above-described second embodiment. More specifically, in the surrounding area of the pattern regions 552 of the mask body 55, there are provided the aperture to relieve a stress arising in stretching the mask (a stress relief region), and the testing aperture to check the device performance (EL light emission, and the like) after the vapor deposition. As a result, there may be a case where it is difficult to locate the movable member in the proximity of the pattern regions 552. It is to be noted that the stress relief region may be provided for alleviating concentration of stresses in a mask assembly process (especially in a tension relief process), for example, and is capable of reducing a positional displacement of the passage holes from design target values thereof. In some mask patterns, if the stress relief region is not provided, a significant positional displacement could occur in stretching the mask, or the mask could be broken at a location where stresses concentrate. Meanwhile, by putting the movable member closer to the pattern regions 552, the sensitivity of the positional adjustment for the shift amount of the movable member increases. Therefore, it may be preferable to control shifting of the movable member more accurately, which could lead to an increase in man-hour for adjustment or costs of an adjuster. In these cases, a structure of providing the slits 23 as described in the above-described first embodiment may be used in combination. In other words, the positional accuracy of the passage holes 55a may be put close to the design target values by properly setting up dimensions and shapes of the slits 23 and the holes 23a in consideration of a positional relationship between the movable member and the pattern regions 552.

Third Embodiment

Figure 24A:
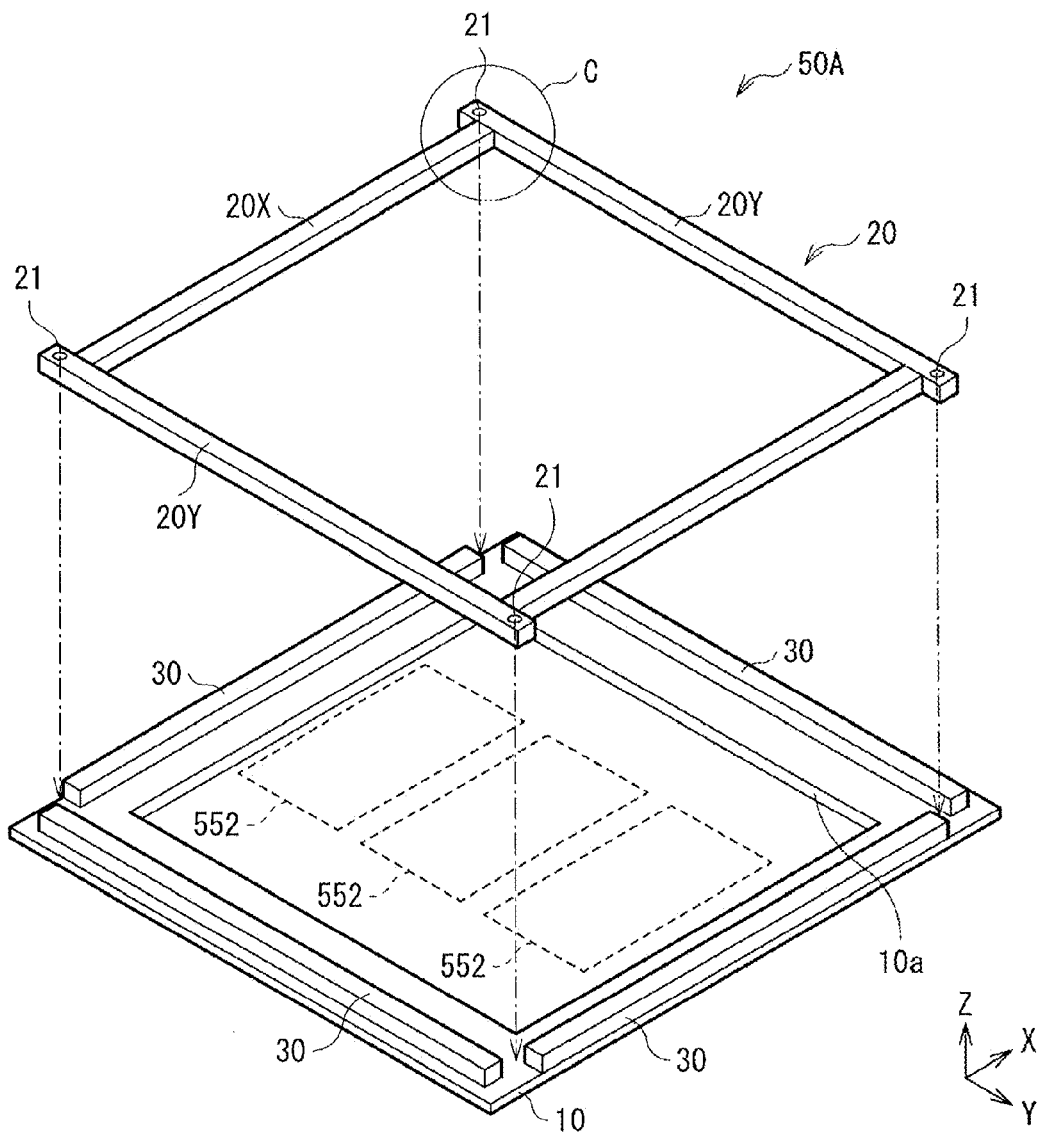
FIG. 24A is a perspective view of an evaporation mask (adjusting frame) according to a third embodiment of the present disclosure.

FIG. 24A is an X-Y plan view of an evaporation mask (adjusting frame 50A) according to a third embodiment of the present disclosure. In this regard, a mask body 55 is omitted in the illustration, and regions corresponding to pattern regions 552 are denoted with dashed lines. As is the case with the above-described first embodiment, the evaporation mask according to the third embodiment may be also used in a manufacturing process of a display unit using organic EL devices, for example. As with the adjusting frame 50 according to the above-described first embodiment, the adjusting frame 50A holds a mask body 55, and includes movable members 20X and 20Y, and a supporting member 30 on a base frame 10, as well as includes an adjusting mechanism 40.

However, the third embodiment differs from the above-described first embodiment in that the movable members 20X and 20Y are provided in conjunction with each other on the base frame 10 (the movable members 20X and 20Y are provided via coupling sections C). In other words, in the third embodiment, the movable members 20X and 20Y are mounted at predetermined locations on the base frame 10 in an integrated state in a mask assembly process.

Figure 24B:
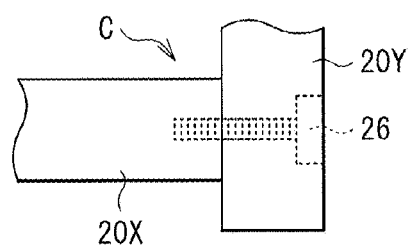
FIG. 24B is an enlarged view of a coupling section illustrated in FIG. 24A.

FIG. 24B is an enlarged view of an area in the proximity of the coupling section C. The coupling section C has a mechanism for integrated connection on a surface where the movable members 20X and 20Y comes in contact with each other. For example, as shown in the drawing, a configuration may be made in such a manner that each of the movable members 20X and 20Y is provided with a screw hole that communicates with each other, and the movable members 20X and 20Y are joined by inserting a bolt 26 into this screw hole.

Figure 25:
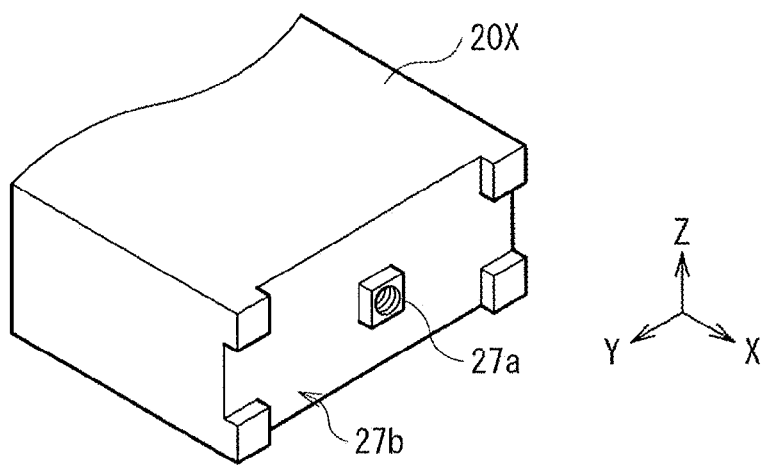
FIG. 25 is a schematic diagram showing a configuration of an abutting surface of the movable member.

FIG. 25 is a schematic diagram enlarging a configuration of an abutting surface of the movable member 20X that comes in contact with the movable member 20Y. As illustrated in the drawing, on the abutting surface of the movable member 20X, a screw hole 27a into which the bolt 26 is inserted is provided, and a recessed portion 27b is formed. A pattern shape of the recessed portion 27b is not limited specifically. However, this is configured to form a void in a state of being coupled with the movable member 20Y, and to be served as a groove (for drainage of fluid) for draining cleaning liquid and the like. Such a recessed portion 27b may be formed on only one of abutting surfaces each of the movable members 20X and 20Y, or may be formed on both of the abutting surfaces.

Figure 26A:
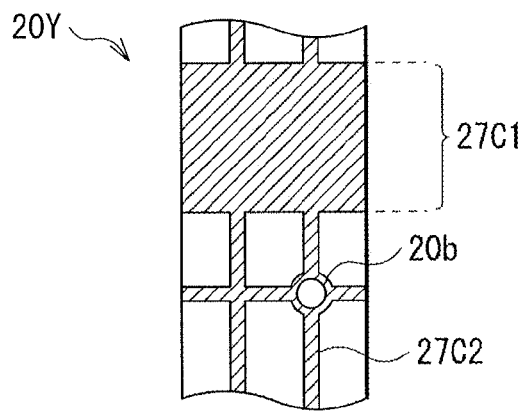
FIG. 26A is a schematic diagram showing a configuration of a rear surface of the movable member.
Figure 26B:
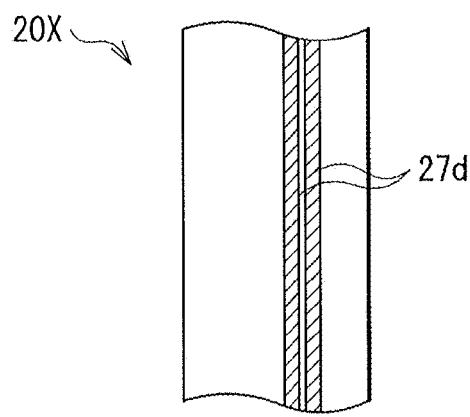
FIG. 26B is a schematic diagram showing a configuration of a rear surface of the movable member.

FIG. 26A schematically shows a configuration of a rear surface (surface on the side of the base frame 10) of the movable member 20Y. FIG. 26B schematically shows a configuration of a rear surface (surface on the side of the base frame 10) of the movable member 20X. As illustrated in the drawings, on the rear surfaces of the movable members 20X and 20Y as well, there are also provided recessed portions 27c1, 27c2, and 27d for drainage of fluid that are similar to the above-described recessed portion 27b. A pattern shape each of the recessed portions 27c1, 27c2, and 27d is not limited specifically. However, for example, as shown in FIG. 26A, when the movable member 20Y has a screw hole 20b into which a fixing bolt 25 is inserted, the stripe-shaped or grid-shaped recessed portion 27c2 is provided in the proximity of the screw hole 20b. At a location relatively far away from the screw hole 20b, the recessed portion 27c1 with the wide base area is provided. Further, as shown in FIG. 26B, in the movable member 20X, the stripe-shaped recessed portion 27d is provided along the extending direction (X-axis direction), for example.

In the third embodiment, as described above, by having a structure in which the movable members 20X and 20Y are coupled (integrated) in the adjusting frame 50A, it is possible to suppress occurrence of wrinkle on the mask body 55 during a heating time (vapor deposition, cleaning, and the like), for example.

Figure 27:
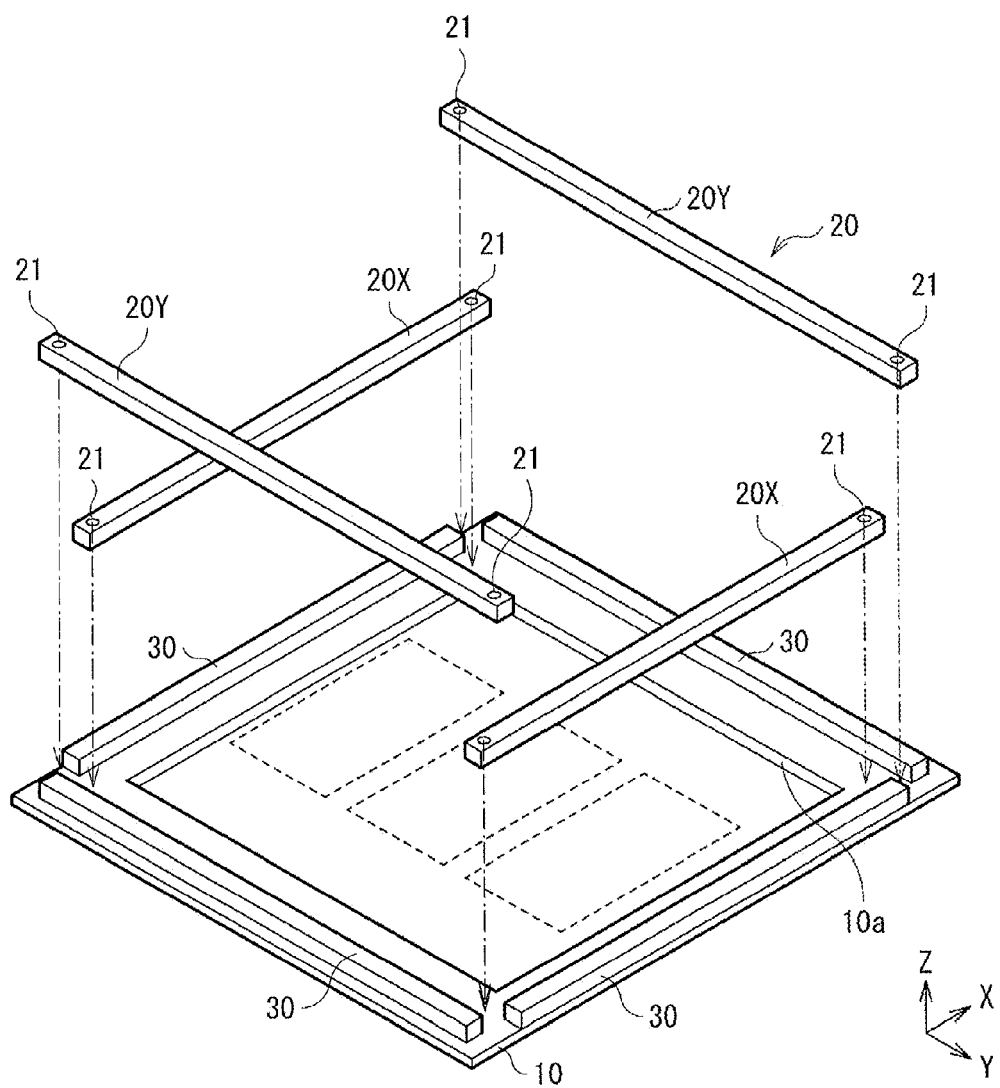
FIG. 27 is a perspective view of an evaporation mask (adjusting frame) according to a comparative example.
Figure 28:
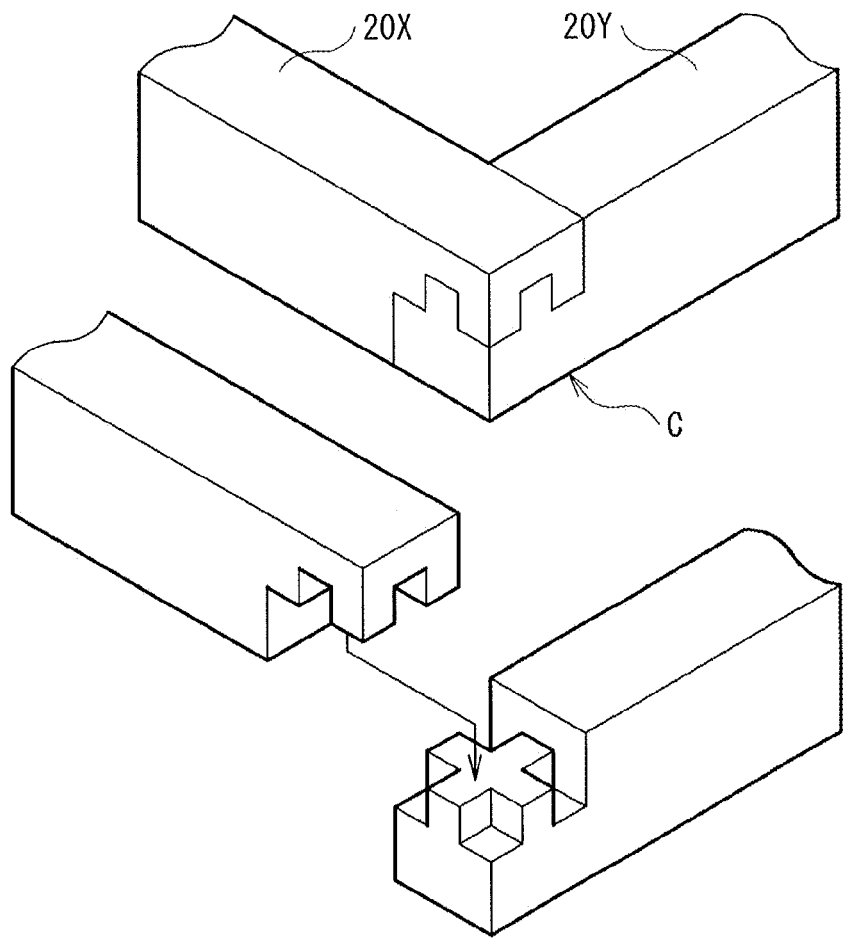
FIG. 28 is a schematic diagram showing another configuration example of the coupling section.
Figure 29:
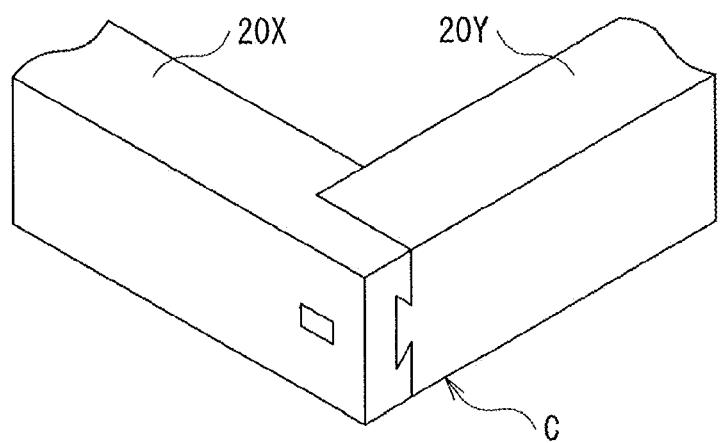
FIG. 29 is a schematic diagram showing still another configuration example of the coupling section.

Here, as a comparative example of the third embodiment, FIG. 27 shows an example of an adjusting frame that is configured by mounting the movable members 20X and 20Y on the base frame 10 individually (without integrating them). In this example, for example, a total of four movable members 20X and 20Y may be mounted discretely at each of predetermined positions on the base frame 10, and both ends each of the movable members 20X and 20Y may be fixed with fixing bolts 21. In an evaporation mask that is manufactured by welding the mask body 55 with the adjusting frame assembled in such a manner, wrinkle may occur during a heating time in some cases. As a result, this may cause the adhesiveness between a substrate to be evaporated (glass and the like) and the mask body 55 to be deteriorated, which may degrade the positional accuracy of patterns at the time of vapor deposition.

On the contrary, in the adjusting frame 50A according to the third embodiment, the movable members 20X and 20Y are mounted and fixed on the base frame 10 in a state of being integrated by the coupling sections C. Therefore, even when temperature of the mask body 55 or the adjusting frame 50A is raised in association with heating, and a tension balance in the X-axis direction and the Y-axis direction varies, it is less likely that a relative shift (relative positional displacement) in the X-axis direction and the Y-axis direction between the movable members 20X and 20Y will occur. Further, when a fine adjustment is made for four corners of the mask body 55 at the time of positional adjustment (correction) of the passage holes 55a, and the like, it is also less likely that the relative shift as described above will occur. This allows occurrence of the wrinkle on the mask body 55 to be suppressed. Accordingly, it is possible to improve the positional accuracy of the mask patterns.

On the other hand, when the movable members 20X and 20Y are mounted in an integrated manner, it is more likely that residual liquid will be generated in deposition equipment during cleaning and other processes. To deal with such an issue, the recessed portions for drainage of liquid (for example, above-described recessed portions 27b, 27c1, 27c2, and 27d) are provided on abutting surfaces, rear surfaces, and the like of the movable members 20X and 20Y, thus allowing generation of the residual liquid as mentioned above to be suppressed.

Figure 30:
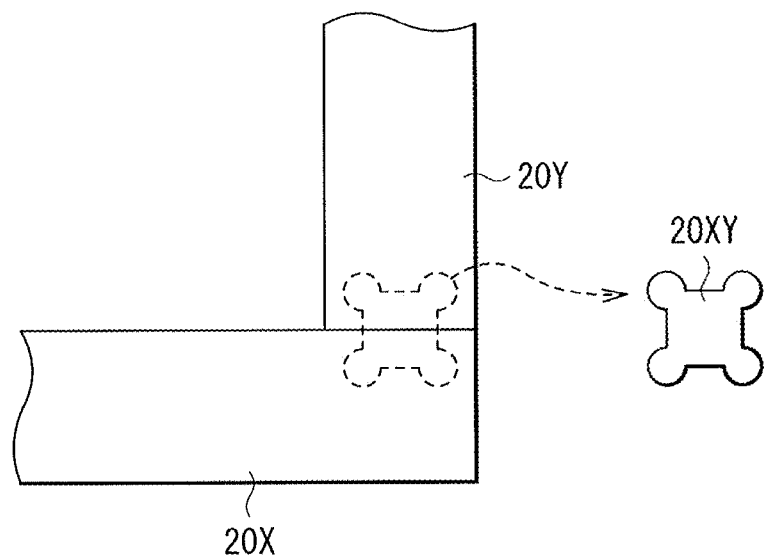
FIG. 30 is a schematic diagram showing further still another configuration example of the coupling section.
Figure 31:
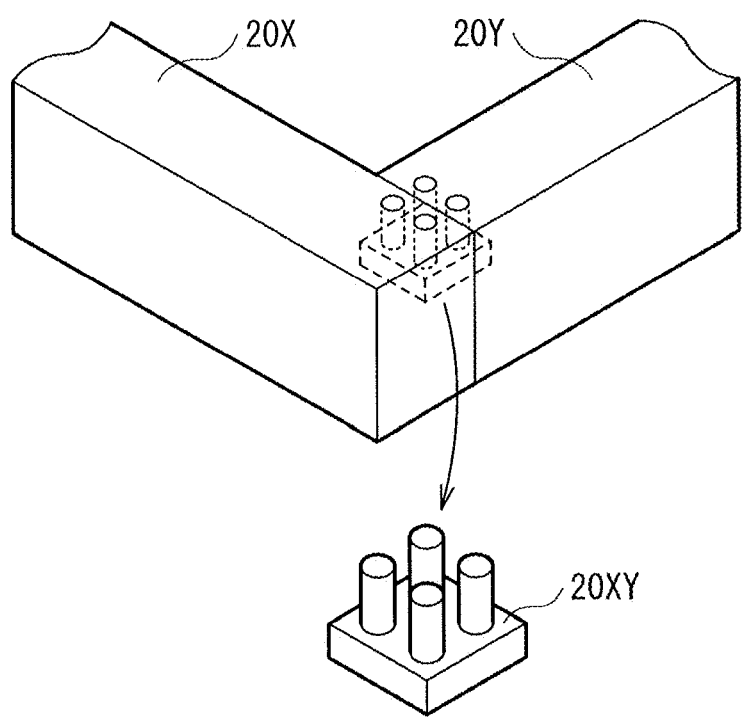
FIG. 31 is a schematic diagram showing further still another configuration example of the coupling section.

It is to be noted that, for a structure of the coupling section C, various coupling structures are usable in addition to a structure in which the above-described bolt 26 is used. Some examples of these structures are shown in FIG. 28 to FIG. 31. In examples illustrated in FIG. 28 and FIG. 29, concave and convex shapes that are fitted to each other are made on the abutting surfaces (abutting portions) of the movable members 20X and 20Y. By such a fitting of the movable members 20X and 20Y, the movable members 20X and 20Y may be coupled. Alternatively, as shown in FIG. 30 and FIG. 31, the movable members 20X and 20Y may be coupled using another connecting part 20XY (connecting member). The connecting part 20XY has a shape that is fitted to each of the movable members 20X and 20Y, and is embedded into each of the movable members 20X and 20Y. Further, the coupling section C may be formed in combination of fitting of these shapes with the use of bolts.

Fourth Embodiment

Figure 32:
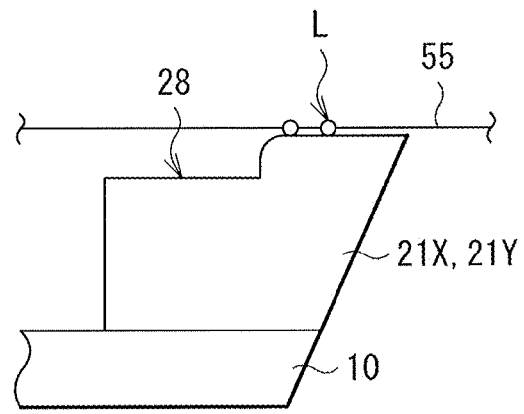
FIG. 32 is a cross-sectional view of an evaporation mask according to a fourth embodiment of the present disclosure.

FIG. 32 shows a cross-sectional structure of an evaporation mask according to a fourth embodiment of the present disclosure. As is the case with the above-described first embodiment, the evaporation mask including an adjusting frame according to the fourth embodiment may be also used in a manufacturing process of a display unit using organic EL devices, for example. As with the adjusting frame 50 according to the above-described first embodiment, the adjusting frame according to the fourth embodiment holds a mask body 55, and includes movable members (movable members 21x and 21Y) and a supporting member 30 on a base frame 10, as well as includes an adjusting mechanism 40.

In the fourth embodiment, however, a stepped section 28 (recessed portion) is provided on a surface each of the movable members 21x and 21Y in opposition to the mask body 55. The stepped section 28 may be provided at a selective region on the outer side (on the side closer to a supporting member 30) on each of the top surfaces of the movable members 21x and 21Y, for example. This makes it possible to reduce the contact area (welding area) of each of the movable members 21X and 21Y and the mask body 55. A welding point L is provided (on a convex surface) to avoid the stepped sections 28 of the movable members 21X and 21Y. It is to be noted that, with the exception of having the stepped sections 28 on the surfaces in opposition to the mask body 55, the movable members 21X and 21Y have configurations similar to those of the movable members 20X and 20Y according to the above-described first embodiment.

Figure 34A:
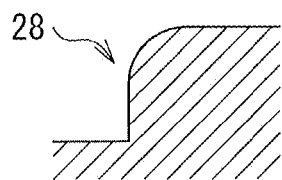
FIG. 34A is a cross-sectional schematic diagram showing an example of a structure of a corner on a stepped portion.
Figure 34B:
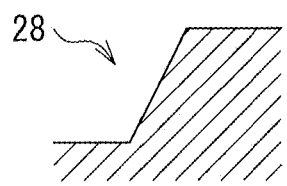
FIG. 34B is a cross-sectional schematic diagram showing an example of a structure of a corner on the stepped portion.
Figure 34C:
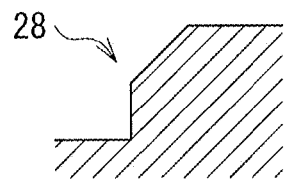
FIG. 34C is a cross-sectional schematic diagram showing an example of a structure of a corner on the stepped portion.

It is to be noted that a curved surface as shown in FIG. 34A may be preferably formed at a corner (an edge of the recessed portion on the side of the mask body 55) of the stepped section 28. Alternatively, as shown in FIG. 34B and FIG. 34C, an inclined surface (tapered surface) may be formed. Such a configuration makes it possible to prevent the mask body 55 from being damaged due to the presence of a stepped structure.

In the fourth embodiment, as described above, the movable members 21X and 21Y have the stepped sections 28 on the surfaces in opposition to the mask body 55, and thus it is possible to suppress the displacement of the passage holes 55a that may arise in bonding the mask body 55 with the adjusting frame, for example, with the help of a mechanism to be hereinafter described. This allows the positional accuracy of the mask patterns to be improved.

Figure 33:
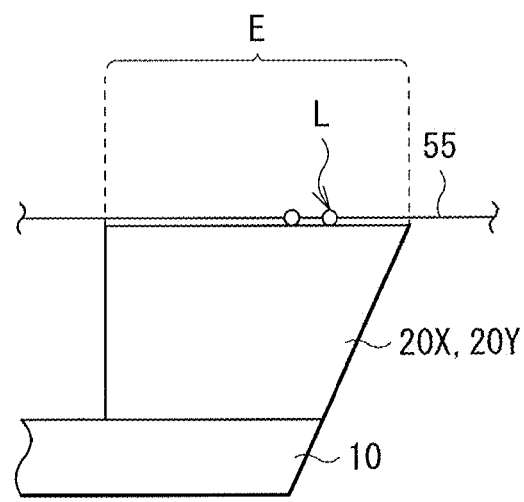
FIG. 33 is a cross-sectional view of an evaporation mask according to a comparative example.

Here, as a comparative example of the fourth embodiment, FIG. 33 shows a cross-sectional configuration of an evaporation mask using movable members 20X and 20Y having no stepped sections 28 as the adjusting frame. As described above, in bonding the mask body with the adjusting frame, the mask body 55 is fixed to the adjusting frame by welding (for example, electric resistance or laser welding, and the others) with tension applied to the mask body 55. At this time, it is more likely that a floating portion (non-contact portion) will be generated because the mask body 55 and top surfaces of the movable members 20X and 20Y do not come in contact with one another uniformly over a whole in-plane area E. In such a case, the floating portion may be occasionally eliminated by compulsion by exerting a force to bring the movable members 20X and 20Y and the mask body 55 into contact with one another, resulting in the passage holes 55a being displaced.

Accordingly, in the fourth embodiment, the movable members 21X and 21Y have the stepped sections 28 on surfaces in opposition to the mask body 55, thus reducing the contact area (welding area) of each of the movable members 21X and 21Y and the mask body 55. This makes it possible to suppress generation of the above-described floating portion (non-contact portion), as well as to reduce the displacement of the passage holes 55a that may be caused in bonding the mask body 55 with the adjusting frame, or in any other case. Therefore, it is possible to improve the positional accuracy of the mask patterns.

Figure 35:
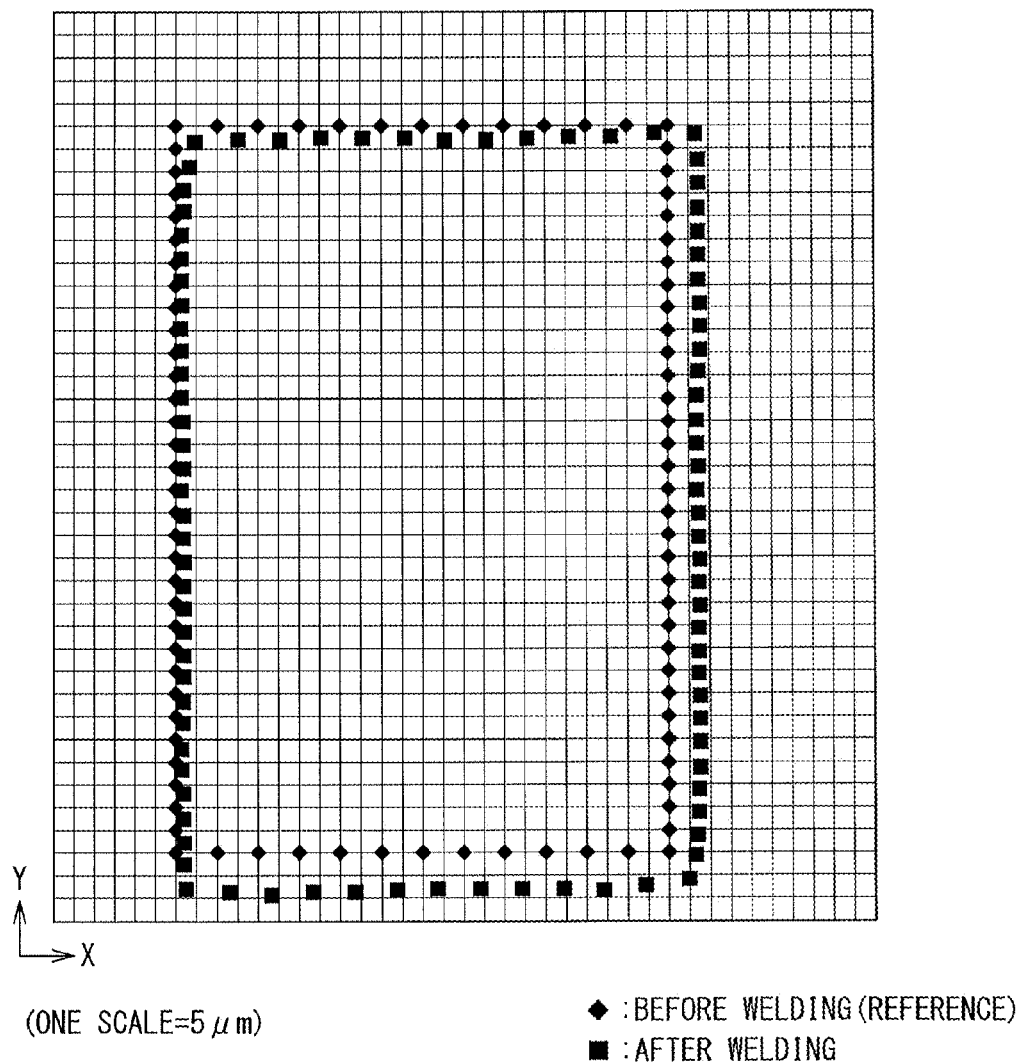
FIG. 35 is a characteristic diagram showing an observation result before and after welding of the evaporation mask illustrated in FIG. 33.
Figure 36:
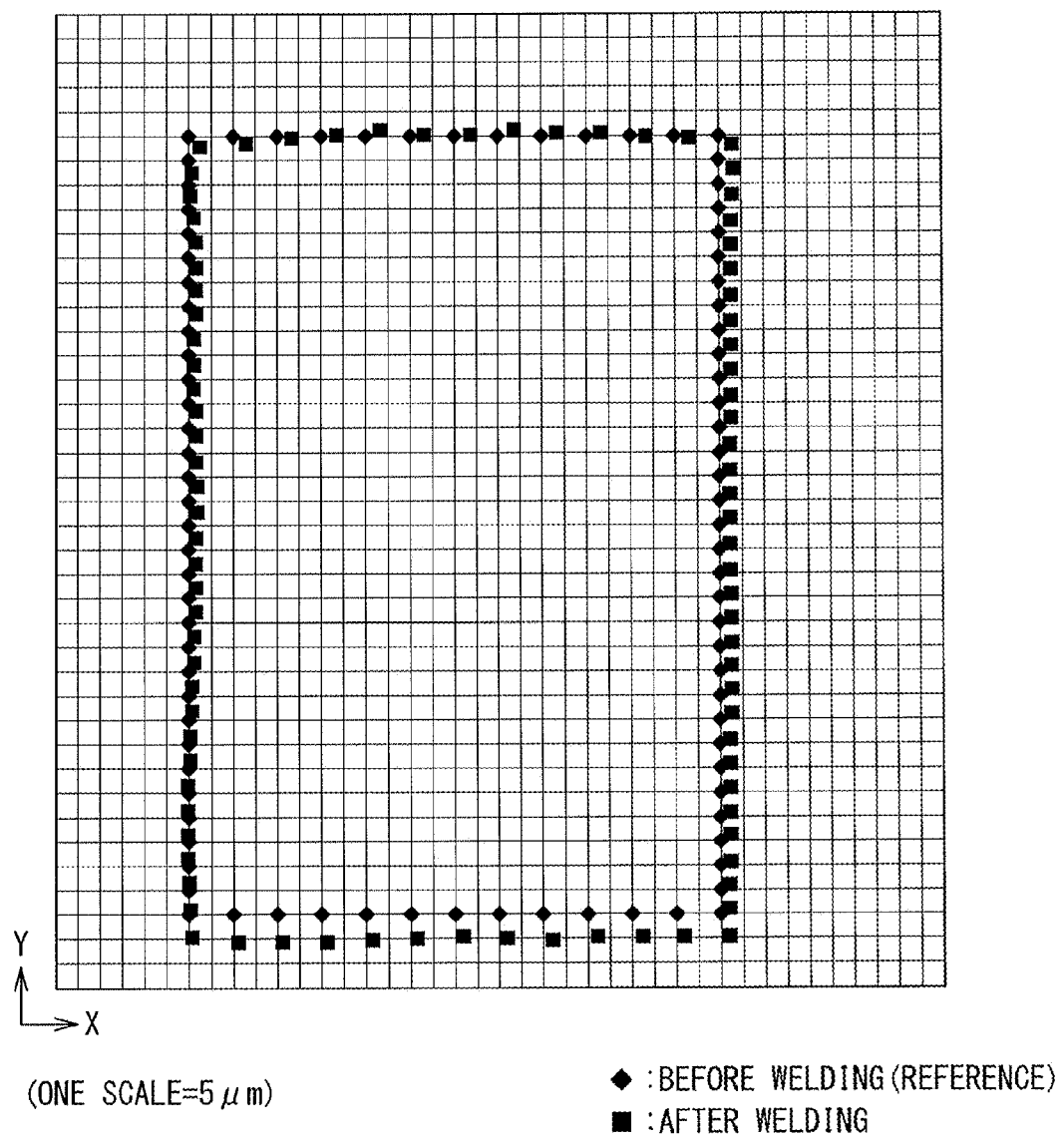
FIG. 36 is a characteristic diagram showing an observation result before and after welding of the evaporation mask illustrated in FIG. 32.

Hereinafter, actual measurement results of the mask patterns according to the fourth embodiment are presented. On this occasion, the base frame 10 having an aperture 10a of about 900 mm×900 mm in size, and a thickness of about 12 mm was used, and the mask body 55 in which the single pattern region 552 is formed on a foil made of inver with a thickness of about 12 mm was used. In such a mask pattern, measurement was made for a position of each point on an outer edge of the pattern region 552. FIG. 35 shows positions of the measuring points immediately after fixing to the frame by welding in a case of the use of the movable members illustrated in FIG. 33. Relative to reference values prior to the welding, the positional displacement occurred after the welding, and the displacement amount (maximum value) was within the range of about −7 to +7 μm in the X-axis direction, and within the range of about −10 to +10 μm in the Y-axis direction. On the other hand, FIG. 36 shows positions of the measuring points immediately after fixing to the frame by welding in a case of the use of the movable members 21X and 21Y according to the fourth embodiment. This allowed the displacement amount to be suppressed down to a value within the range of about −3 to +3 μm in the X-axis direction, and a value within the range of about −5 to +5 μm in the Y-axis direction. In other words, this made it possible to reduce the positional displacement amount by about 50% as compared with a case where the stepped sections are not provided.

In the evaporation mask according to any of the above-described first to fourth embodiments, the positional adjustment as mentioned above may be performed manually, or may be performed automatically using an apparatus (position adjuster) as described hereinafter.

[Example of Position Adjuster]

Figure 37:
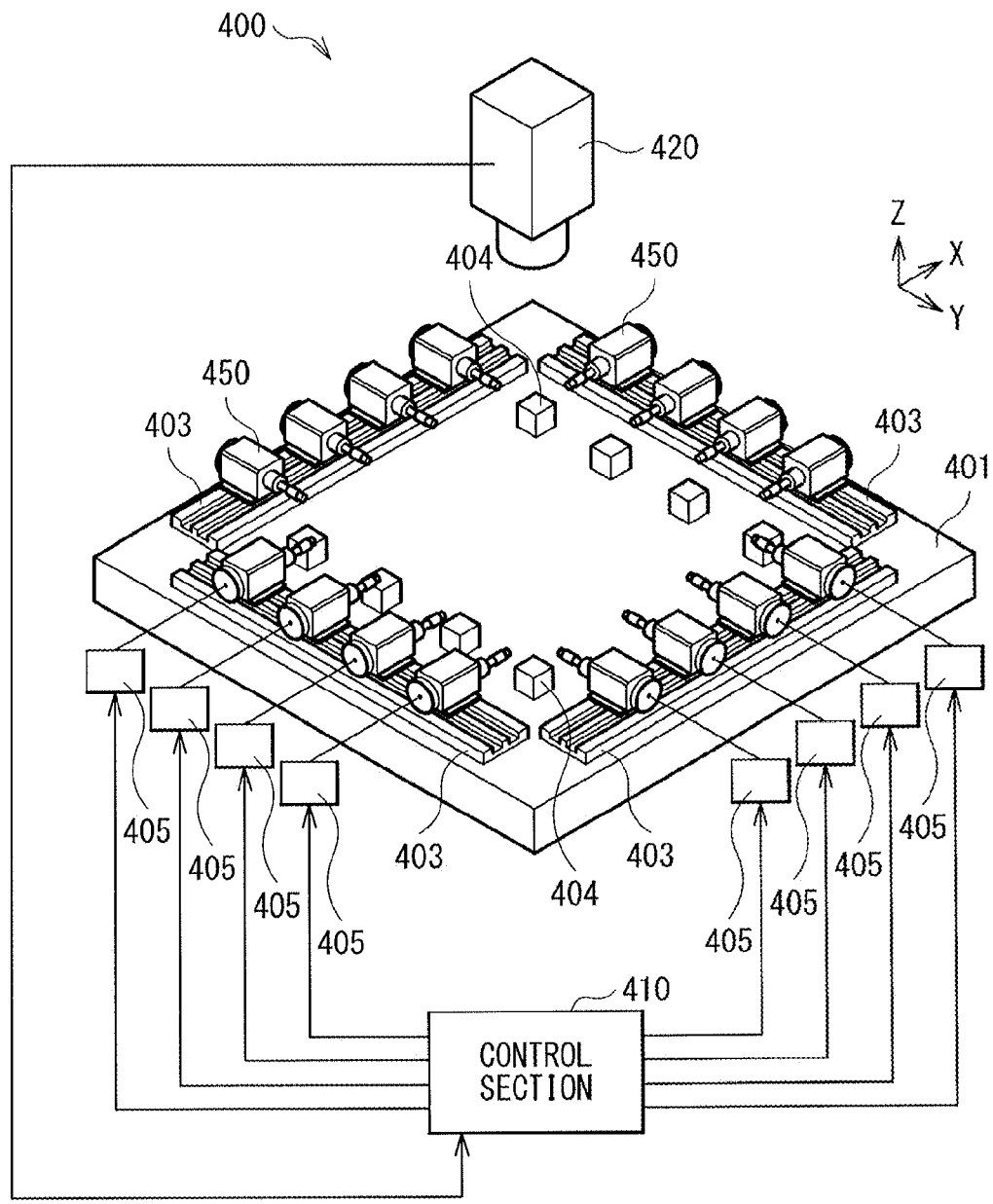
FIG. 37 is a perspective view showing a configuration of a position adjuster.

FIG. 37 shows a configuration of a position adjuster (position adjuster 400) to manufacture the evaporation mask according to each of the above-described embodiments. The position adjuster 400 includes a supporting base 401, base frame supporting sections 404 that are provided on the supporting base 401, and manipulators 450 that are disposed on the outer side of the base frame supporting sections 404 to manipulate the adjusting mechanism 40. Further, the position adjuster 400 also has motor drivers 405 to drive the respective manipulators 450, a camera 420 that is disposed in the upper part, and a control section 410.

The plurality of manipulators 450 are arrayed along four sides of the rectangular supporting base 401. Further, on the supporting base 401, there are provided guide mechanisms 403 that allow positions of the manipulators 450 to be changed. Each of the guide mechanisms 403 has a guide rail through which a position each of the manipulators 450 is enabled to be changed along each side, and the manipulators 450 are fixable with bolts and the like at intended positions.

Figure 38:
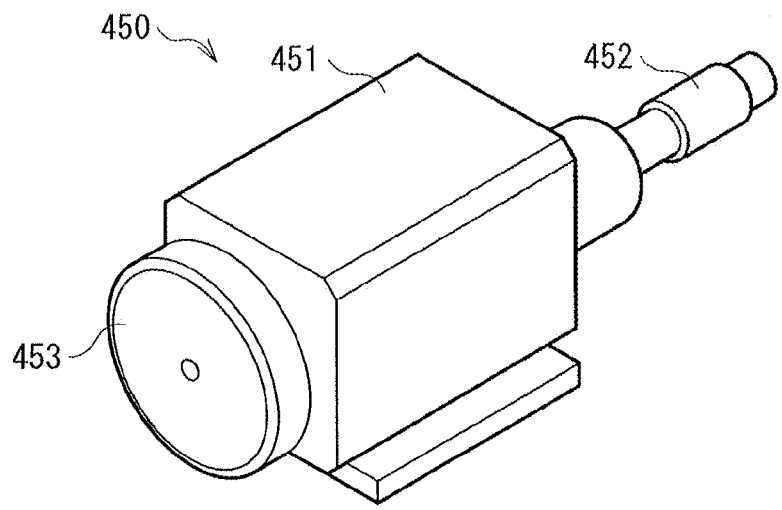
FIG. 38 is a perspective view showing a manipulator illustrated in FIG. 37.

FIG. 38 is a perspective view showing the single manipulator 450. The manipulator 450 has a motor 451 with a built-in reducer (for example, reducing gear), and a wrench adapter 452 that is mounted on an output axis of the motor 451. An end of the wrench adapter 452 is connectable with the pull bolt 41 and the push bolt 42 of the above-described adjusting mechanism 40. For example, the manipulator 450 may be connected with the adjusting mechanism 40 (see FIG. 1) in such a manner that a recessed portion (not shown in the drawing) is provided on the end of the wrench adapter 452, and respective heads 41a and 42a of the pull bolt 41 and the push bolt 42 (see FIGS. 6A and 6B) are fitted to the recessed portion on the end of the wrench adapter 452.

As the motor 451, for example, a stepping motor or a servomotor may be used. A typical stepping motor may often have a built-in reducing gear.

A reduction ratio to be achieved by the reducer may be, for example, set at a value within the range of about 1/60 to 1/40, typically at a value of about 1/50. In a case of the manipulator 450 having the reduction ratio of about 1/50, it is possible to achieve the driving amount of about 10 μm/revolution when an M3 bolt is used. This makes it possible to facilitate the positional adjustment in the μm order of magnitude.

It is to be noted that the motor 451 is provided with a handle 453 as well, and it is also possible to set up the manipulator 450 to drive the adjusting mechanism 40 by turning the handle 453 manually by an operator.

The camera 420 detects positional information (actual positional information) of the mask patterns by photographing the pattern regions 552 of the mask body 55 specifically in a mask apparatus 100 (see FIG. 22) that is supported by the supporting base 401. The camera 420 may be moved in the X-axis direction and the Y-axis direction.

The control section 410 stores design positional information that is the positional information of the mask patters at the minimum among prestored design information of the mask body 55, for example. Further, the control section 410 acquires actual positional information of the above-described mask patterns that is detected by the camera 420, and executes predetermined arithmetic computation to be hereinafter described based on this actual positional information and the above-described design positional information.

Typically, the control section 410 may be configured of a computer such as CPU, RAM, and ROM. The design positional information of the mask patterns may be stored in another memory device that is connected with this control section 410 in a wired or wireless transmission method.

For example, at least one manipulator 450 may be provided only on one side of the supporting base 401, or at least one manipulator 450 may be provided on each of at least two sides. The number and the arrangement of the manipulators 450 may be set up properly depending on the shape and the array of the pattern regions 552.

Figure 39:
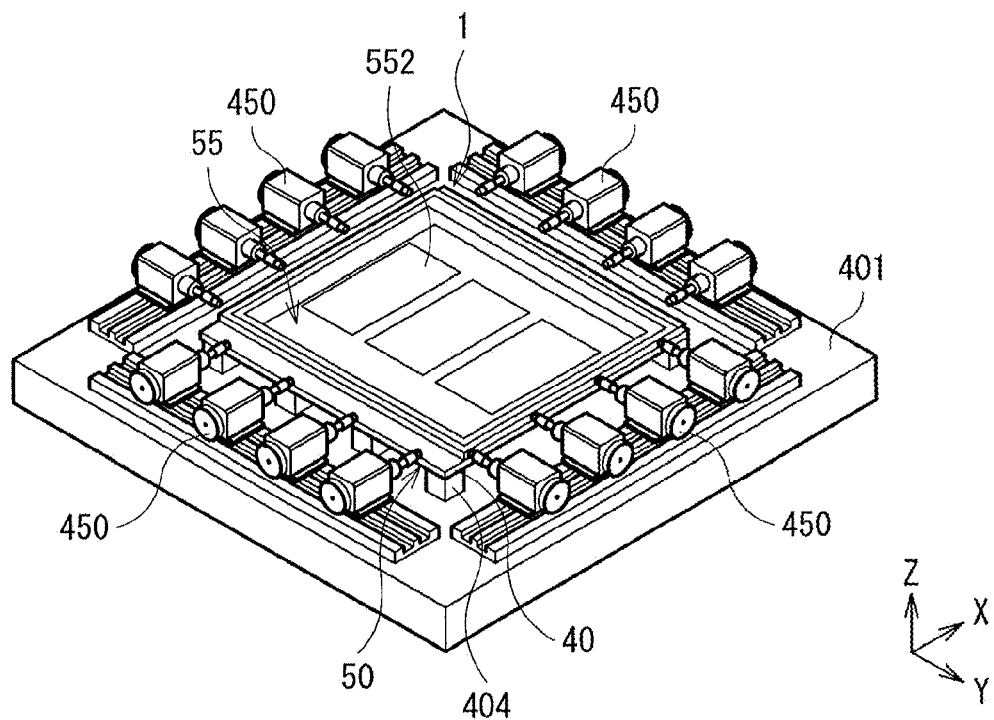
FIG. 39 is a perspective view showing a state where the evaporation mask is set up on the position adjuster.

When the position adjuster 400 as described above is used, as shown in FIG. 39, for example, the evaporation mask 1 illustrated in FIG. 1 and the like is placed on the base frame supporting sections 404, and is fixed by a fixture and the like that are not shown in the drawing. Subsequently, a position each of the manipulators 450 on the guide mechanisms 403 is set up, and positioning each of the manipulators 450 is carried out. Thereafter, the wrench adapter 452 of the manipulators 450 is connected with the pull bolt 41 and the push bolt 42 of the adjusting mechanism 40. It is to be noted that when the evaporation mask 1 includes the above-described position holding mechanism (FIGS. 7A to 7C, and the like), after the automatic positional adjustment is performed by the position adjuster 400, positions of the mask patterns after the adjustment are held by such a position holding mechanism.

Application Example 1

Next, the description is provided on an application example 1 (method of manufacturing a display unit) of the evaporation mask according to any of the above-described first to fourth embodiments. An example of the display unit according to the embodiment of the present disclosure may include an organic EL display unit (organic EL display unit 2) using organic EL devices as described hereinafter.

Figure 40:
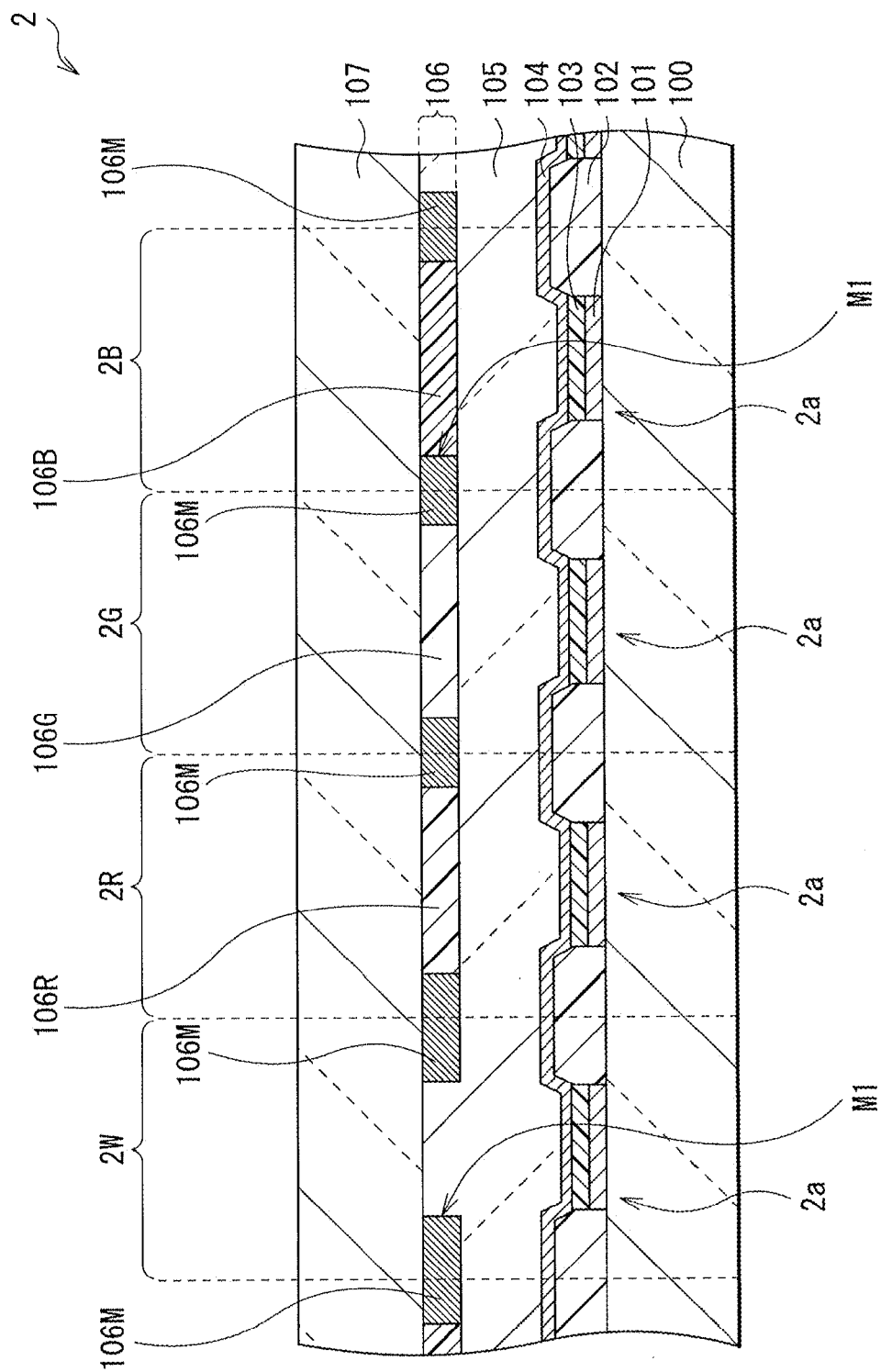
FIG. 40 is a cross-sectional view showing a configuration of a display unit (organic EL display unit) according to an application example 1.

FIG. 40 shows an example of a configuration of the organic EL display unit 2. The organic EL display unit 2 is a display unit that performs a color image display using, for example, a top surface light emission method (so-called top emission method). In this organic EL display unit 2, the above-described image display is carried out using four-color sub-pixels including a sub-pixel exhibiting the high luminance (for example, a sub-pixel 2W of white (W)) in addition to sub-pixels of three primary colors of red (R), green (G), and blue (B) (sub-pixels 2R, 2G, and 2B). These sub-pixels 2R, 2G, 2B, and 2W may be arranged, for example, in a matrix pattern on a drive substrate 10, and each of these sub-pixels may include, for example, an organic EL device 2a as a light-emitting device. These organic EL devices 2a are hermetically sealed on the drive substrate 10 using a sealing substrate 20.

Figure 41A:
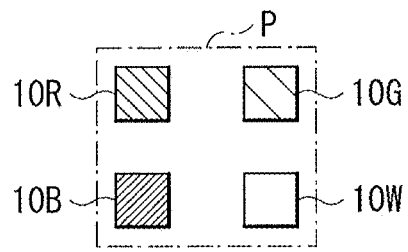
FIG. 41A is a schematic diagram showing a two-dimensional arrangement example of sub-pixels illustrated in FIG. 40.
Figure 41B:
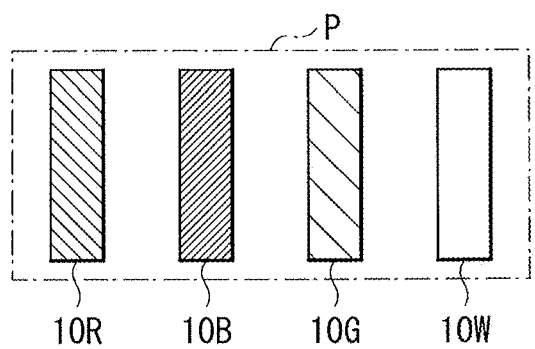
FIG. 41B is a schematic diagram showing a two-dimensional arrangement example of the sub-pixels illustrated in FIG. 40.

Each of FIG. 41A and FIG. 41B shows an example of two-dimensional arrangement of the sub-pixels 2R, 2G, 2B, and 2W. As shown in FIG. 41A, for example, the square-shaped or rectangular sub-pixels 2R, 2G, 2B, and 2W may be arranged in a two-row/two-column configuration. Alternatively, as shown in FIG. 41B, the rectangular sub-pixels 2R, 2G, 2B, and 2W may be configured to be arranged along a uniaxial direction. In either example of configuration, a set of the sub-pixels 2R, 2G, 2B, and 2W configures a single pixel P.

In each of the organic EL devices 2a, an inter-pixel insulating film 102, an organic layer 103, and a second electrode 104 are laminated on a first electrode 101. In the organic EL display unit 2, a protective film 105 is formed to cover these organic EL devices 2a, and a sealing substrate 107 is bonded on the protective film 105 with a color filter layer 106 and the like in between. The organic layer 103 includes a hole injection layer, a hole transportation layer, a light-emitting layer, an electron transportation layer, and the like that are not shown in the drawing. The light-emitting layer out of these layers may be, for example, a light-emitting layer that emits different color light for each of the sub-pixels (red light-emitting layer, green light-emitting layer, blue light-emitting layer, or white light-emitting layer), and is painted in different colors in a predetermined pattern for each of the sub-pixels. The color filter layer 106 has a red filter 106R at a region corresponding to the sub-pixel 2R, a green filter 106G at a region corresponding to the sub-pixel 2G, and a blue filter 106B at a region corresponding to the sub-pixel 2B. Further, at a region between each of the sub-pixels on the color filter layer 106, there is provided a black matrix layer 106M. It is to be noted that such a color filter layer 106 may be provided in terms of the contrast and the like, but not necessarily has to be provided.

In a process of manufacturing the organic EL display unit 2 that is configured in this manner, for example, to start with, the first electrode 101 may be formed in such a manner that an electrode material film is formed on the drive substrate 100 using, for example, a sputtering method, and thereafter the formed film is patterned by etching using, for example, a photolithographic approach. Subsequently, by forming the inter-pixel insulating film 102 over a whole surface of the drive substrate 100, and thereafter by performing the patterning, a region on the first electrode 101 is opened. Afterward, the organic layer 103 is formed on the first electrode 101 using, for example, a vacuum deposition method. Then, the second electrode is formed, for example, over a whole area on the organic layer 103, and subsequently the protective film 105 is formed. Finally, by bonding the sealing substrate 107 with the color filter layer 106 in between, it is possible to manufacture the organic EL display unit illustrated in FIG. 1.

In the above-described manufacturing process, in forming the organic layer 103 (or a part of each of the above-described layers that configure the organic layer 103), by using any of the evaporation masks described in the above-described embodiments and the like, it is possible to form a pattern of the organic layer 103 for each of the sub-pixels. As mentioned above, the pattern accuracy of the evaporation mask is improved, thus making it possible to achieve the higher-definition image display of the organic EL display unit. Further, the use of any of the evaporation masks according to the above-described first and second embodiments is advantageous for high-volume production of a panel.

Application Example 2

Figure 42:
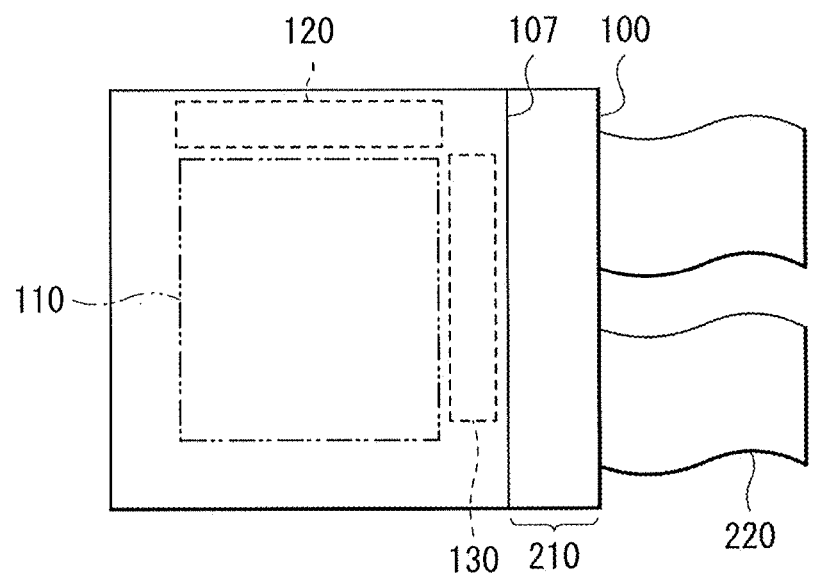
FIG. 42 is a plan view showing a simplified configuration of a module including the display unit illustrated in FIG. 40.

The above-described display unit (organic EL display unit 2) is usable for electronic apparatuses in every field that display externally input image signals or internally generated image signals as images or video pictures. On this occasion, as a module as illustrated in an example in FIG. 42, the organic EL display unit 2 may be incorporated into various electronic apparatuses such as a smartphone, a television apparatus, a digital camera, a notebook personal computer, a mobile terminal including a mobile phone, and a video camera that are cited hereinafter. In FIG. 42, on a drive substrate 100, for example, an effective pixel region 110 including sub-pixels that are arranged two-dimensionally may be formed, and further a signal line driving circuit 120, a scan line driving circuit 130, and the like may be formed as a peripheral circuit section for the effective pixel region 110. A region 210 exposed from a sealing substrate 107 is provided on one side of the drive substrate 100. At this exposed region 210, external connection terminals (not shown in the drawing) are formed by extending wiring of the signal line driving circuit 120 and the scan line driving circuit 130. An FPC (Flexible Printed Circuit Board) 220 for signal input/output is provided at these external connection terminals.

Figure 43:
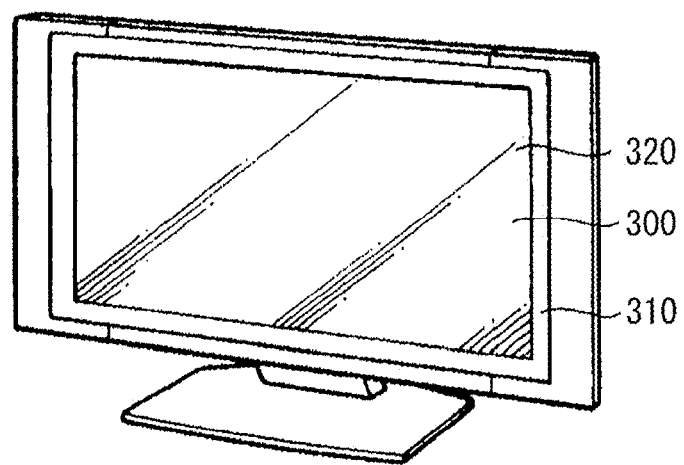
FIG. 43 is a perspective view showing a configuration of a television apparatus.

FIG. 43 shows an external appearance of a television apparatus. This television apparatus may have, for example, an image display screen section 300 including a front panel 310 and a filter glass 320. The image display screen section 300 is configured of the above-described organic EL display unit 2.

Figure 44A:
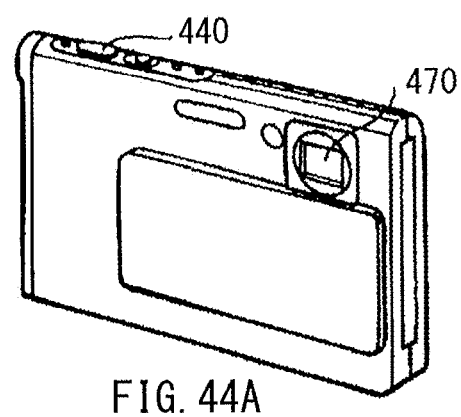
FIG. 44A is a perspective view showing a configuration of a digital still camera.
Figure 44B:
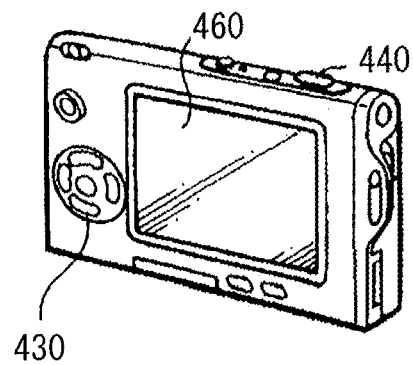
FIG. 44B is a perspective view showing a configuration of a digital still camera.

Each of FIG. 44A and FIG. 44B shows an external appearance of a digital still camera. This digital still camera may have, for example, a light-emitting section 470 for flashing, a display section 460, a menu switch 430, and a shutter button 440. The display section 420 is configured of the above-described organic EL display unit 2.

Figure 45:
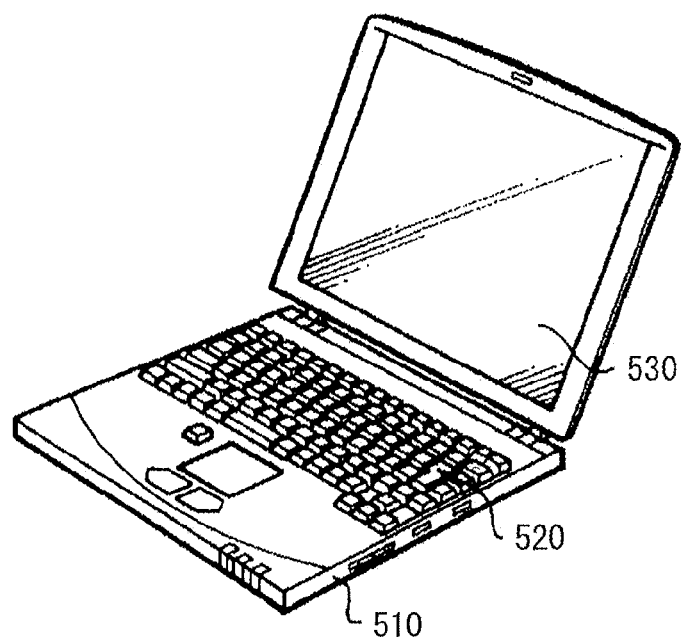
FIG. 45 is a perspective view showing an external appearance of a personal computer.

FIG. 45 shows an external appearance of a notebook personal computer. This notebook personal computer may have, for example, a main unit 510, a keyboard 520 for operation of entering characters and the like, and a display section 530 to display images. The display section 530 is configured of the above-described organic EL display unit 2.

Figure 46:
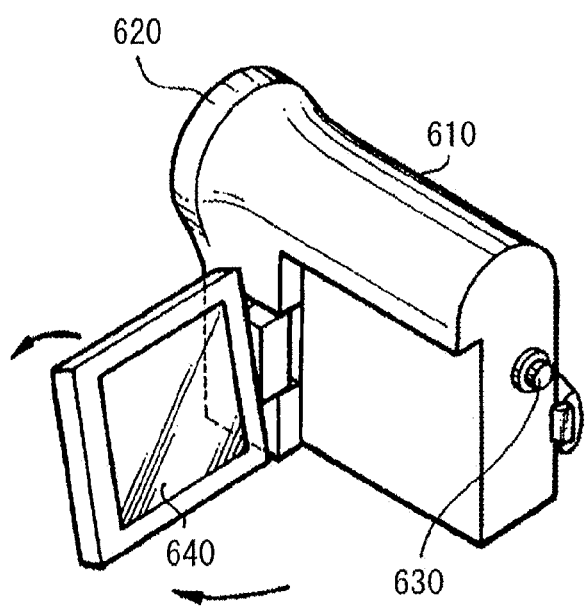
FIG. 46 is a perspective view showing an external appearance of a video camera.

FIG. 46 shows an external appearance a video camera. This video camera may have, for example, a main unit section 610, a lens 620 to photograph an object that is provided at the front lateral surface of this main unit section 610, a start/stop switch 630 at the photographing time, and a display section 640. The display section 640 is configured of the above-described organic EL display unit 2.

Figure 47A:
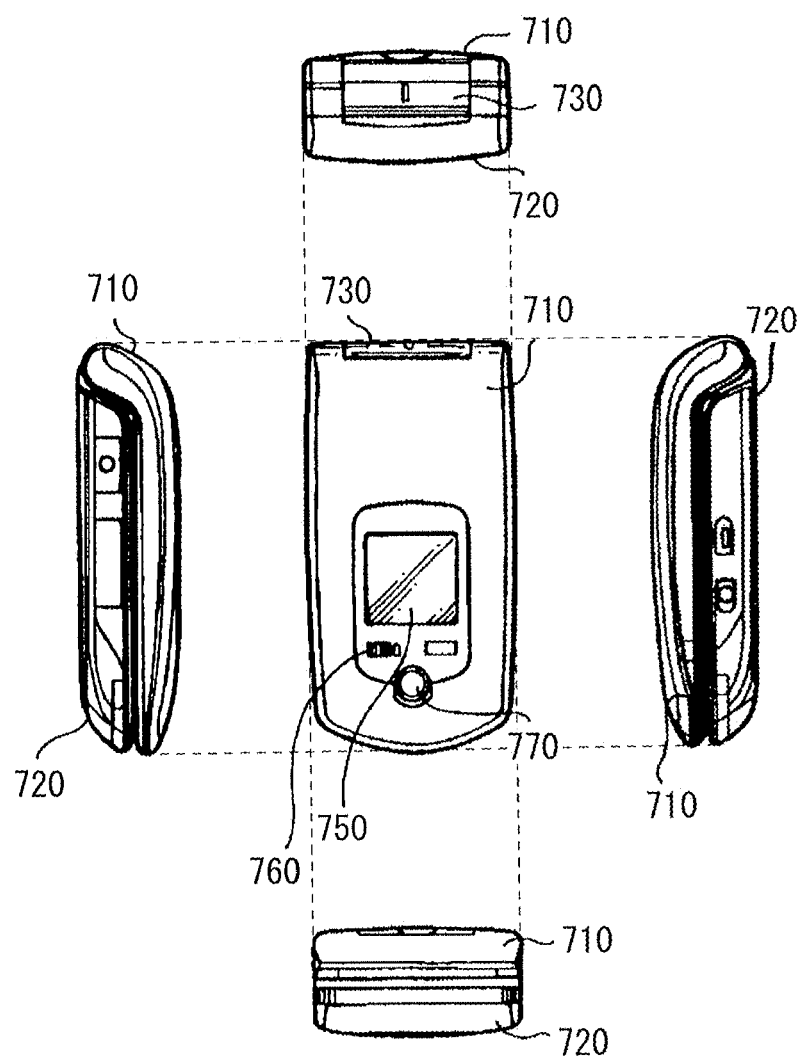
FIG. 47A is a plan view showing a configuration of a mobile phone.
Figure 47B:
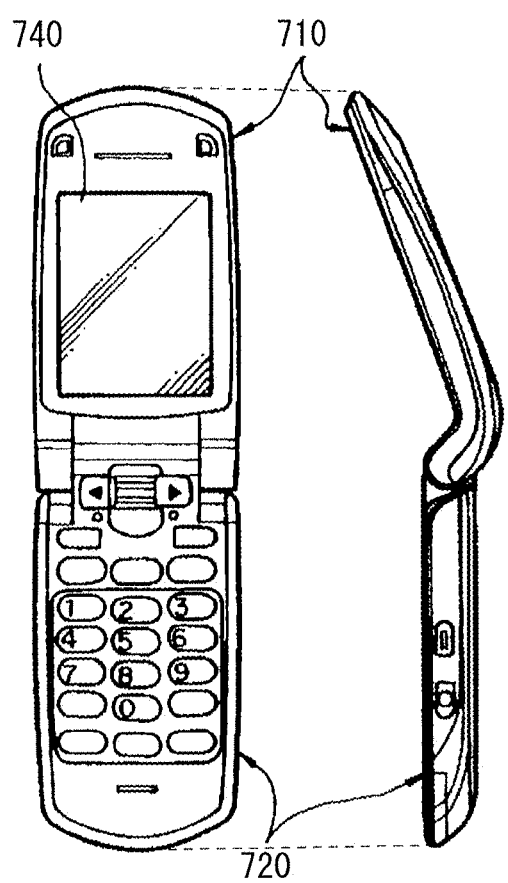
FIG. 47B is a plan view showing a configuration of a mobile phone.

Each of FIG. 47A and FIG. 47B shows an external appearance of a mobile phone. For example, this mobile phone may join an upper chassis 710 and a lower chassis 720 by a connecting section (hinge section) 730, and may have a display 740, a sub-display 750, a picture light 760, and a camera 770. The display 740 or the sub-display 750 is configured of the above-described organic EL display unit 2.

Figure 48A:
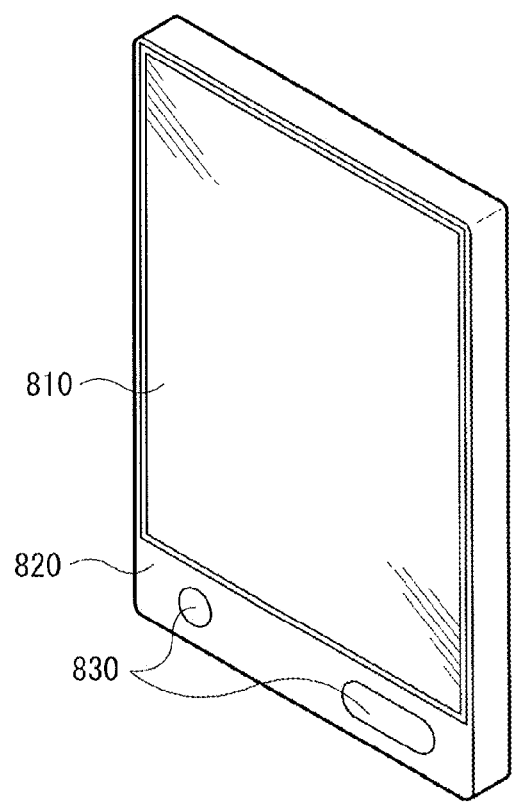
FIG. 48A is a perspective view showing a configuration of a smartphone.
Figure 48B:
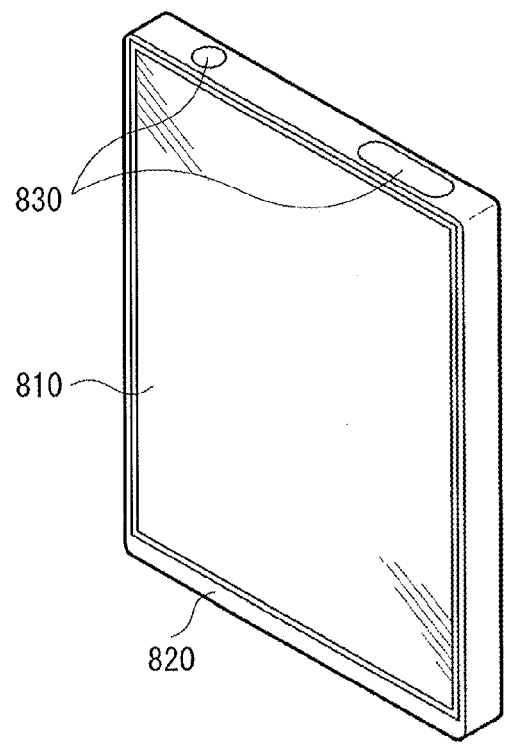
FIG. 48B is a perspective view showing a configuration of a smartphone.

Each of FIG. 48A and FIG. 48B shows an external appearance of a smartphone. This smartphone may have, for example, a display section 810, a non-display section (chassis) 820, and an operating section 830. The operating section 830 may be provided in the front side (FIG. 48A) or on the top side (FIG. 48B) of the non-display section 820. The display section 810 is configured of the above-described organic EL display unit 2.

The present disclosure is described thus far with reference to the embodiments and the application examples. However, the present disclosure is not limited to these embodiments and the like, and various modifications may be made. For example, in the above-described embodiments and the like, the description is provided on an example where the evaporation mask is used in a process of manufacturing the organic EL display unit. However, the evaporation mask according to any of the embodiments of the present disclosure is not limited to a vapor deposition process for an organic material, and may be applicable to a vapor deposition process for a metallic material, dielectric material, and the like. Alternatively, the evaporation mask may be used not only as a mask for a vapor deposition application, but also as a mask for lithographic exposure or printing. Although the evaporation mask is manufactured through a process where a foil to which tension is applied is bonded with a frame body (frame) and the like, the evaporation mask is widely applicable to the positional adjustment of patterns.

Further, in the above-described embodiments and the like, the description is provided on a configuration in which the single pull bolt 41 and the single push bolt 42 are arranged alternately (in pairs). However, the plurality of pull bolts 41 may be arranged consecutively, or the plurality of push bolts 42 may be arranged consecutively.

In addition, in the above-described embodiments and the like, the description is provided on an example where the movable members (20X and 20Y) are provided along all of four sides of the base frame 10. However, the movable member according to any of the embodiments of the present disclosure may be provided along one or more sides of the base frame 10. For example, two movable members may be provided on two facing sides.

Moreover, in the above-described embodiments (in particular, the first, second, and fourth embodiments) and the like, the description is provided on an example of a configuration in which the movable members 20X and 20Y are mounted on each side of the base frame 10, but the movable members may be formed integrally in such a manner that the movable members are coupled to take a frame-like shape. Considering materials, manufacturing costs, and the like, the movable member may be often prepared for each side (in an elongated shape).

Further, in the above-described embodiments and the like, the description is provided on an example of the adjusting mechanism 40 using the pull bolt 41 and the push bolt 42. However, the adjusting mechanism according to any of the above-described embodiments of the present disclosure is not limited thereto, and the adjusting mechanism using another mechanism, for example, a piezoelectric device may be also acceptable.

Furthermore, in the above-described embodiments and the like, a bolt (fixing bolt) is used as the position holding mechanism (fixing mechanism). However, in addition to such a bolt, a clamp mechanism, a piezoelectric device, or the like may be used alternatively.

It is to be noted that two or more of characteristic parts in each of the embodiments described thus far are allowed to be used in combination.

The present disclosure may be configured as follows.

(1) An evaporation mask, including:
a mask body including a pattern region configured of a plurality of passage holes; and
an adjusting frame configured to hold the mask body and having a mechanism capable of adjusting positions of the passage holes on the mask body, wherein
the adjusting frame has a frame-like base material, and a movable member that is provided along one or more sides of the base material to be bonded with an outer edge of the mask body, and at least a part of which is deformable on the base material, and
one or a plurality of slits are provided at a selective region of the movable member.

(2) The evaporation mask according to (1), wherein the one or the plurality of slits are each provided to extend along a width direction of the movable member.

(3) The evaporation mask according to (2), wherein the plurality of slits are provided to be open on both sides in the width direction of the movable member.

(4) The evaporation mask according to any one of (1) to (3), wherein a hole having a diameter larger than a width of the slit is provided to communicate with an end of the slit.

(5) The evaporation mask according to any one of (1) to (4), further including a fixing mechanism configured to fix the movable member to the base material, wherein
the fixing mechanism is provided between the slits.

(6) The evaporation mask according to any one of (1) to (5), wherein a plurality of the pattern regions are arranged on the mask body, and the slit is provided to face a region between the pattern regions in the movable member.

(7) The evaporation mask according to any one of (1) to (6), wherein the adjusting frame has
a supporting section provided on the base material or provided in a manner of being integrated with the base material, and supporting the movable member, and
an adjusting mechanism configured to apply tensile force or pushing force to the movable member along a uniaxial direction with the supporting section in between.

(8) An evaporation mask, including:
a mask body including a pattern region configured of a plurality of passage holes; and
an adjusting frame configured to hold the mask body and having a mechanism capable of adjusting positions of the passage holes on the mask body, wherein
the adjusting frame has a frame-like base material, and a movable member that is provided along one or more sides of the base material to be bonded with an outer edge of the mask body, and at least a part of which is deformable on the base material, and
the movable member is provided in proximity to the pattern region.

(9) An evaporation mask, including:
a mask body including a pattern region configured of a plurality of passage holes; and
an adjusting frame configured to hold the mask body and having a mechanism capable of adjusting positions of the passage holes on the mask body, wherein
the adjusting frame has a frame-like base material, and a plurality of movable members each provided along each side of the base material to be bonded with an outer edge of the mask body, and at least a part each of which is deformable on the base material, and
the plurality of movable members are provided in conjunction with one another.

(10) The evaporation mask according to (9), wherein the movable members are coupled by bolts.

(11) The evaporation mask according to (9) or (10), wherein abutting surfaces of the respective movable members each have shapes fitted to each other.

(12) The evaporation mask according to any one of (9) to (11), further including a connecting member configured to be fitted to each of abutting surfaces of the movable members.

(13) The evaporation mask according to any one of (9) to (12), wherein a recessed portion for drainage of liquid is provided on one or more of abutting surfaces of the movable members.

(14) The evaporation mask according to any one of (9) to (13), wherein a recessed portion for drainage of liquid is provided on a surface of the movable member on the side of the base material.

(15) An evaporation mask, including:
a mask body including a pattern region configured of a plurality of passage holes; and
an adjusting frame configured to hold the mask body and having a mechanism capable of adjusting positions of the passage holes on the mask body, wherein
the adjusting frame has a frame-like base material, and a movable member that is provided along one or more sides of the base material to be bonded with an outer edge of the mask body, and at least a part of which is deformable on the base material, and
the movable member has a recessed portion on a surface in opposition to the mask body.

(16) The evaporation mask according to (15), wherein an end of the recessed portion on the side of the mask body has a curved surface or an inclined surface.

(17) A method of manufacturing a display unit, the method including:
forming a first electrode;
forming an organic layer including a light-emitting layer on the first electrode with use of an evaporation mask; and
forming a second electrode on the organic layer, wherein
the evaporation mask includes a mask body including a pattern region configured of a plurality of passage holes, and an adjusting frame configured to hold the mask body and having a mechanism capable of adjusting positions of the passage holes on the mask body,
the adjusting frame has a frame-like base material, and a movable member that is provided along one or more sides of the base material to be bonded with an outer edge of the mask body, and at least a part of which is deformable on the base material, and
one or a plurality of slits are provided at a selective region of the movable member.

(18) A method of manufacturing a display unit, the method including:
forming a first electrode;
forming an organic layer including a light-emitting layer on the first electrode with use of an evaporation mask; and
forming a second electrode on the organic layer, wherein
the evaporation mask includes a mask body including a pattern region configured of a plurality of passage holes, and an adjusting frame configured to hold the mask body and having a mechanism capable of adjusting positions of the passage holes on the mask body,
the adjusting frame has a frame-like base material, and a movable member that is provided along one or more sides of the base material to be bonded with an outer edge of the mask body, and at least a part of which is deformable on the base material, and the movable member is provided in proximity to the pattern region.

(19) A method of manufacturing a display unit, the method including:

forming a first electrode;

forming an organic layer including a light-emitting layer on the first electrode with use of an evaporation mask; and forming a second electrode on the organic layer, wherein the evaporation mask includes a mask body including a pattern region configured of a plurality of passage holes, and an adjusting frame configured to hold the mask body and having a mechanism capable of adjusting positions of the passage holes on the mask body, the adjusting frame has a frame-like base material, and a plurality of movable members each provided along each side of the base material to be bonded with an outer edge of the mask body, and at least a part each of which is deformable on the base material, and the plurality of movable members are provided in conjunction with one another.

(20) A method of manufacturing a display unit, the method including:

forming a first electrode;

forming an organic layer including a light-emitting layer on the first electrode with use of an evaporation mask; and forming a second electrode on the organic layer, wherein the evaporation mask includes a mask body including a pattern region configured of a plurality of passage holes, and an adjusting frame configured to hold the mask body and having a mechanism capable of adjusting positions of the passage holes on the mask body, the adjusting frame has a frame-like base material, and a movable member that is provided along one or more sides of the base material to be bonded with an outer edge of the mask body, and at least a part of which is deformable on the base material, and the movable member has a recessed portion on a surface in opposition to the mask body.

It should be understood by those skilled in the art that various modifications, combinations, sub-combinations, and alterations may occur depending on design requirements and other factors insofar as they are within the scope of the appended claims or the equivalents thereof.

What is claimed is:

1. An evaporation mask, comprising:
a mask body including a pattern region configured of a plurality of passage holes; and
an adjusting frame configured to hold the mask body, wherein
the adjusting frame has a base and a movable member that is provided along one or more sides of the base to be bonded with an outer edge of the mask body, wherein the movable member is fixed to the base at predetermined locations and wherein at least part of the movable member is locally deformable relative to the base, and
one or a plurality of slits are provided in the movable member, wherein a hole having a diameter larger than a width of at least one slit of the plurality of slits is provided to communicate with an end of the at least one slit.

2. The evaporation mask according to claim 1, wherein the one or the plurality of slits are each provided to extend along a width direction of the movable member.

3. The evaporation mask according to claim 2, wherein the plurality of slits are provided to be open on both sides in the width direction of the movable member.

4. The evaporation mask according to claim 1, further comprising a fixing mechanism configured to fix the movable member to the base, wherein
the fixing mechanism is provided between slits of the plurality of slits.

5. The evaporation mask according to claim 1, wherein a plurality of the pattern regions are arranged on the mask body, and at least one slit of the plurality of slits is provided to face a region between the pattern regions in the movable member.

6. The evaporation mask according to claim 1, wherein the adjusting frame has
a supporting section provided on the base or provided in a manner of being integrated with the base, and supporting the movable member, and
an adjusting mechanism configured to apply tensile force or pushing force to the movable member along a uniaxial direction with the supporting section in between.

7. An evaporation mask, comprising:
a mask body including a pattern region configured of a plurality of passage holes; and
an adjusting frame configured to hold the mask body, wherein
the adjusting frame has a base and a plurality of movable members each provided along each side of the base to be bonded with an outer edge of the mask body, wherein the plurality of movable members are fixed to the base at predetermined locations and wherein at least part of one or more of the plurality of movable members is locally deformable relative to the base, and
the plurality of movable members are provided in conjunction with one another, wherein abutting surfaces of the respective movable members each have shapes fitted to each other.

8. The evaporation mask according to claim 7, wherein the plurality of movable members are coupled by bolts.

9. An evaporation mask, comprising:
a mask body including a pattern region configured of a plurality of passage holes; and
an adjusting frame configured to hold the mask body, wherein
the adjusting frame has a base and a plurality of movable members each provided along each side of the base to be bonded with an outer edge of the mask body, wherein the plurality of movable members are fixed to the base at predetermined locations and wherein at least part of one or more of the plurality of movable members is locally deformable relative to the base, and
the plurality of movable members are provided in conjunction with one another, further comprising a connecting member configured to be fitted to each of abutting surfaces of the movable members.

10. The evaporation mask according to claim 7, wherein a recessed portion for drainage of liquid is provided on one or more of abutting surfaces of the plurality of movable members.

11. The evaporation mask according to claim 7, wherein a recessed portion for drainage of liquid is provided on a surface of the plurality of movable members on the side of the base.

* * * * *